(12) United States Patent
Yamazaki et al.

(10) Patent No.: US 7,714,535 B2
(45) Date of Patent: May 11, 2010

(54) POWER STORAGE DEVICE

(75) Inventors: Shunpei Yamazaki, Setagaya (JP);
Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 455 days.

(21) Appl. No.: 11/878,350

(22) Filed: Jul. 24, 2007

(65) Prior Publication Data

US 2008/0024091 A1    Jan. 31, 2008

(30) Foreign Application Priority Data

Jul. 28, 2006    (JP)    ............... 2006-206939

(51) Int. Cl.
 *H01M 10/46*    (2006.01)
(52) U.S. Cl. .................... 320/107
(58) Field of Classification Search ............ 320/107, 320/108, 166; 235/492
See application file for complete search history.

(56) References Cited

U.S. PATENT DOCUMENTS

| | | | |
|---|---|---|---|
| 5,643,804 A | 7/1997 | Arai et al. |
| 5,877,533 A | 3/1999 | Arai et al. |
| 6,410,960 B1 | 6/2002 | Arai et al. |
| 6,682,963 B2 | 1/2004 | Ishikawa |
| 7,056,810 B2 | 6/2006 | Yamazaki et al. |
| 7,067,926 B2 | 6/2006 | Yamazaki et al. |
| 7,109,071 B2 | 9/2006 | Ishikawa |
| 7,164,151 B2 | 1/2007 | Yamazaki et al. |
| 7,230,316 B2 | 6/2007 | Yamazaki et al. |
| 2003/0082889 A1 | 5/2003 | Maruyama et al. |
| 2004/0099926 A1 | 5/2004 | Yamazaki et al. |
| 2004/0124542 A1 | 7/2004 | Kuwabara et al. |
| 2005/0116310 A1 | 6/2005 | Nishi et al. |
| 2006/0214306 A1 | 9/2006 | Yamazaki et al. |
| 2006/0220211 A1 | 10/2006 | Yamazaki et al. |
| 2007/0018164 A1 | 1/2007 | Ishikawa |
| 2008/0169349 A1* | 7/2008 | Suzuki et al. ............... 235/492 |

FOREIGN PATENT DOCUMENTS

| | | |
|---|---|---|
| JP | 2002-049901 | 2/2002 |
| JP | 2005-350823 | 12/2005 |
| JP | 2006-149163 | 6/2006 |

* cited by examiner

*Primary Examiner*—Edward Tso
(74) *Attorney, Agent, or Firm*—Eric J. Robinson; Robinson Intellectual Property Law Office, P.C.

(57) ABSTRACT

In the field of portable electronic devices in the future, portable electronic devices will be desired, which are smaller and more lightweight and can be used for a long time period by one-time charging, as apparent from provision of one-segment partial reception service "1-seg" of terrestrial digital broadcasting that covers the mobile objects such as a cellular phone. Therefore, the need for a power storage device is increased, which is small and lightweight and capable of being charged without receiving power from commercial power. The power storage device includes an antenna for receiving an electromagnetic wave, a capacitor for storing power, and a circuit for controlling store and supply of the power. When the antenna, the capacitor, and the control circuit are integrally formed and thinned, a structural body formed of ceramics or the like is partially used. A circuit for storing power of an electromagnetic wave received at the antenna in a capacitor and a control circuit for arbitrarily discharging the stored power are provided, whereby lifetime of the power storage device can be extended.

17 Claims, 20 Drawing Sheets

POWER STORAGE DEVICE

BACKGROUND OF THE INVENTION

1. Field of the Invention

The present invention relates to a power storage device capable of being charged without receiving power from commercial power.

2. Description of the Related Art

Electronic devices such as a cellular phone, a mobile computer, a digital camera, and a digital audio player have been advanced to be downsized, and a large variety of products have been shipped to the market. In such portable electronic devices, a secondary battery as a power supply for driving is incorporated. As a secondary battery, a lithium-ion battery, a nickel-hydrogen battery, or the like is used. The secondary battery is charged by receiving power from commercial power. For example, a user connects an AC adapter to a household plug socket deposited in each home to charge the secondary battery.

Although portable electronic devices are convenient, the hour of use is restricted by the capacity of the secondary battery. The user of the electronic device needs to pay attention to remaining battery level of the secondary battery and to be always conscious of the charging time. Further, the charging plugs of the electronic devices are different for each device or for each model. Therefore, many AC adapters are required to be possessed.

In contrast, a power storage device is disclosed, in which a permanent magnet is moved back and forth in a slide where a coil is rolled to generate electromagnetic induced electromotive force, whereby the power storage device is charged (for example, Reference 1: Japanese Published Patent Application No. 2006-149163 (FIG. 1, and p. 4)). According to this device, power storage devices are considered to be capable of being charged without receiving power from commercial power supply.

SUMMARY OF THE INVENTION

However, the power storage device utilizing electromagnetic induced electromotive force generated by a coil and a permanent magnet needs a movable portion, and therefore, downsizing of the power storage device is structurally difficult. Moreover, such a power storage device is required to move the magnet as well as to possess it, and the weight of the device is increased because the permanent magnet is used. Therefore, the conventional power storage device has a problem that the volume and the weight thereof are increased, and portability is lost.

Incidentally, in the field of portable electronic devices in the future, portable electronic devices will be desired, which are smaller and more lightweight and can be used for a long time period by one-time charging, as apparent from provision of one-segment partial reception service "1-seg" of terrestrial digital broadcasting that covers the mobile objects such as a cellular phone. Therefore, the need for the power storage device is increased, which is small and lightweight and capable of being charged without receiving power from commercial power.

It is an object of the present invention to provide a power storage device that can be charged without receiving power from commercial power, in which the charging is performed easily while reduction in size and weight and reduction in weight and thickness is achieved. It is another object of the present invention to maintain durability and required functions in the case where such a power storage device becomes small and downsized.

The present invention is to provide a power storage device including an antenna for receiving an electromagnetic wave, a capacitor for storing power, and a circuit for controlling store and supply of power. In a case where the antenna, the capacitor, and the control circuit are integrally formed and thinned, a structural body formed of ceramics or the like is used for part of the integral structure.

The structural body formed of ceramics or the like has resistance to pressing force or bending stress applied from outside. Therefore, in the case of thinning the antenna and the control circuit, the structural body formed of ceramics or the like serves as a protector. In addition, this structural body can have a function as a capacitor.

According to the present invention, a circuit for storing power of an electromagnetic wave received at an antenna in a capacitor and a control circuit for discharging the given power are provided, whereby lifetime of the power storage device can be extended.

When the structural body formed of ceramics or the like is used for part of the power storage device, rigidity can be improved. Accordingly, even when the power storage device is thinned, durability and required functions can be maintained.

For example, even when pressing force is applied with a pointed object such as a tip of a pen, malfunction due to stress applied to the capacitor and the control circuit can be prevented. Moreover, resistance to bending stress can also be provided. In addition, when a wiring for connection is formed in the structural body formed of ceramics or the like so that the antenna and the control circuit are connected, malfunction caused by detachment of a connection portion can be prevented even when bending stress is applied.

DETAILED DESCRIPTION OF THE INVENTION

Figure 1:
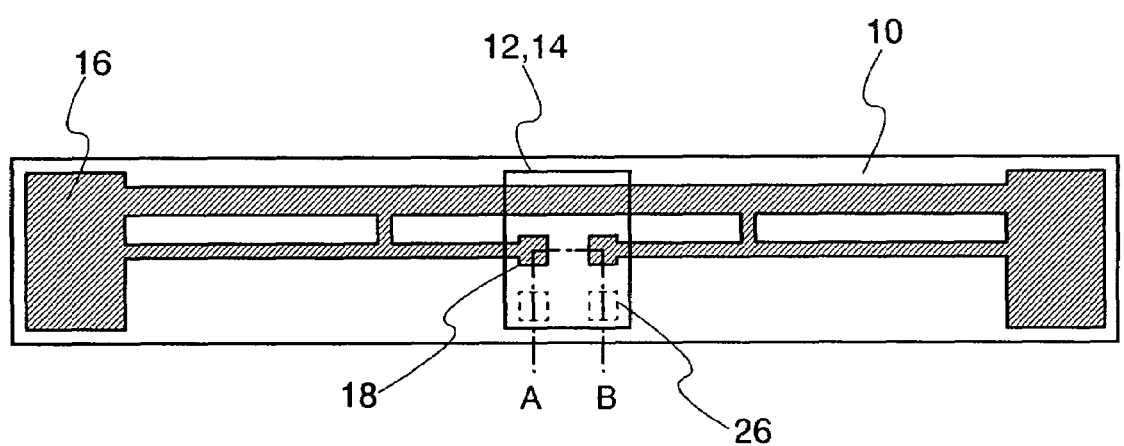
FIG. 1 is a plan view showing one mode of a power storage device of the present invention.

Hereinafter, an embodiment mode and embodiments of the present invention is described below with reference to the accompanying drawings. Note that the present invention is not limited to the following description and it is easily understood by those skilled in the art that modes and details can be modified in various ways without departing from the purpose and the scope of the present invention. Accordingly, the present invention should not be interpreted as being limited to the description of the embodiment mode below. Note that like portions in the drawings may be denoted by the like reference numerals in a structure of the present invention to be given below.

A power storage device of the present invention includes a first structural body provided with an antenna, a power supply control circuit formed using a semiconductor layer interposed between insulating layers that are provided over and below the semiconductor layer, and a second structural body provided with a capacitor and having higher rigidity than the first structural body. This second structural body includes at least a dielectric layer inside, and the capacitor is preferably formed using the dielectric layer. The second structural body is formed of ceramics or the like, which has high rigidity, whereby mechanical strength of the power storage device can be maintained even when the power supply control circuit is thinned.

FIG. 1 shows one mode of such a power storage device. A first structural body 10 is formed of an insulating material. The thickness of the first structural body 10 is 1 μm to 100 μm, preferably, 5 μm to 30 μm. As the insulating material, a plastic sheet, a plastic film, a glass epoxy resin, a glass plate, paper, a nonwoven fabric, or other variety of objects can be used. An antenna 16 is formed using a conductive material at least on one of surfaces of the first structural body 10. A structure of the antenna is preferably differentiated depending on a frequency band of an electromagnetic wave used by the power storage device. The antenna may have a suitable shape for a frequency band, when a frequency in a short wave band (electromagnetic wave with frequency of 1 to 30 MHz), an ultrashort wave band (electromagnetic wave with frequency of 30 to 300 MHz), or a microwave band (electromagnetic wave with frequency of 0.3 to 3 GHz) is used. FIG. 1 shows a dipole antenna, which is suited for communication in the ultrashort wave band and the microwave band. A monopole antenna, a patch antenna, a spiral antenna, a loop antenna, or the like can be used as the antenna, other than the dipole antenna shown in FIG. 1.

The antenna 16 is provided with an antenna terminal 18 in order to be connected to a power supply control circuit 14. The power supply control circuit 14 is formed so that at least a part thereof overlaps with the first structural body 10. A second structural body 12 is used as a connector for tightening connection of the first structural body 10 and the power supply control circuit 14.

Figure 2:
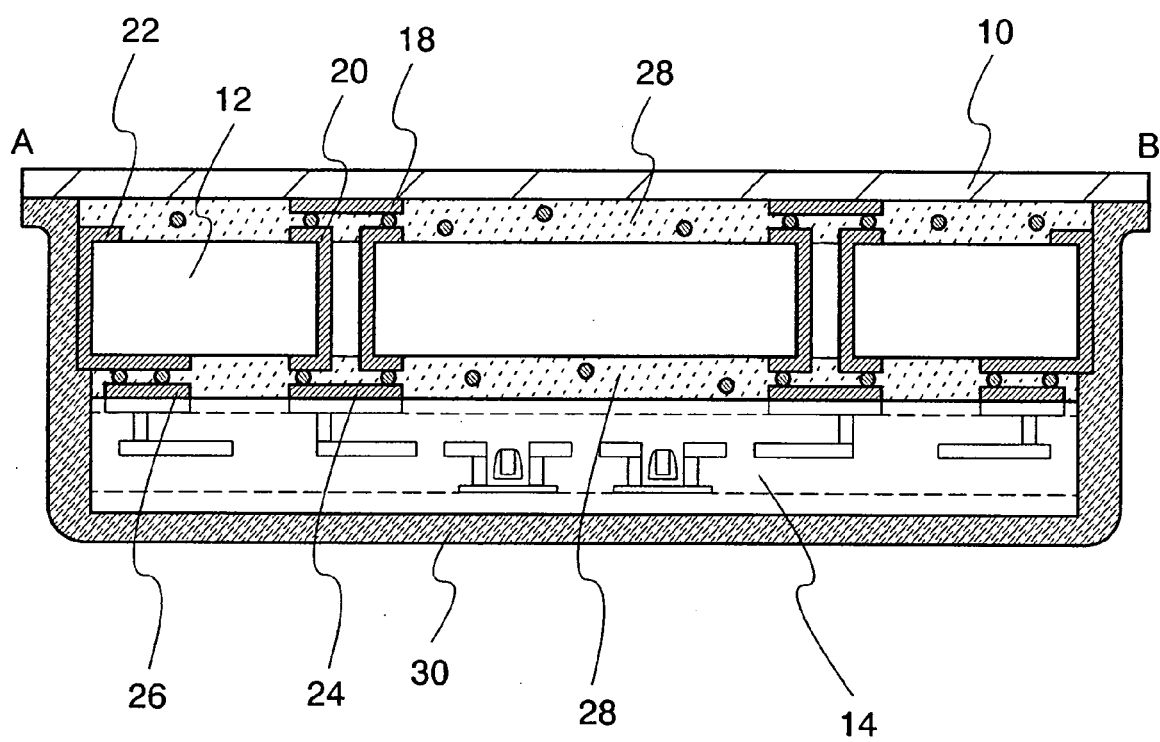
FIG. 2 is a cross-sectional view showing an example of a structure taken along a line A-B of FIG. 1.

FIG. 2 shows a cross-sectional structure of the power storage device taken along a line A-B of FIG. 1. The second structural body 12 is located to face one side on which the antenna terminal 18 of the first structural body 10 is formed. The power supply control circuit 14 is located to face the other side of the second structural body 12. A through electrode 20 is formed in the second structural body 12 at a position corresponding to that of the antenna terminal 18. The through electrode 20 is formed so as to be connected to a connection electrode 24 of the power supply control circuit 14 on the other side of the second structural body 12. The through electrode 20 is formed using a metal foil or metal paste in a through hole formed in the second structural body 12.

The second structural body 12 has a thickness of 0.1 μm to 50 μm, preferably 5 μm to 30 μm, and is preferably harder than the first structural body 10. In addition, the second structural body 12 preferably has toughness and elasticity to certain bending stress. This is because in a case where the first structural body 10 is formed of a flexible material such as a plastic film or a nonwoven fabric, bending stress can be dispersed when the second structural body 12 has uniform elasticity. Accordingly, disconnection failure between the antenna terminal 18 and the connection electrode 24 which are connected via the through electrode 20 can be prevented. In addition, when the through electrode 20 is formed in the second structural body 12, the power supply control circuit 14 can be downsized.

As the second structural body 12, an insulating substance such as hard plastics or glass can be used, and in particular, the ceramic material is preferably used. This is because the ceramic material realizes the foregoing characteristics and therefore, the material to be used can be selected from a wide range of materials. Further, a plurality of ceramics can be combined to be a compound.

As a typical example of the ceramic material, alumina ($Al_2O_3$) is preferably used as a highly insulating material. In addition, barium titanate ($BaTiO_3$) is preferably used as a high capacitance material. When mechanical strength has higher priority, alumina ($Al_2O_3$), titanium oxide ($TiO_x$), silicon carbide (SiC), tempered glass, or crystallized glass is preferably used. In addition, when composite ceramics in which nanoparticles of SiC are added to $Si_3N_4$, or composite ceramics which contains hexagonal system BN is used, high strength, oxidation resistance, and high toughness can be obtained, which is preferable.

These ceramic materials may be used to form a stacked layer structure of a plurality of layers each having a thickness of 0.1 μm to 2 μm in the second structural body 12. In other words, it is preferable that a stacked-layer substrate be formed and an electrode be formed in each layer to form a stacked layer capacitor in the second structural body 12.

The power supply control circuit 14 is formed using an active element formed of a semiconductor layer having a thickness of 5 nm to 500 nm, preferably, 30 nm to 150 nm. Over and below the semiconductor layer, insulating layers are provided. These insulating layers are formed as layers for protecting the semiconductor layer. In addition, they may be used as a functional layer such as a gate insulating layer. A typical example of an active element is a field-effect transistor. Since the semiconductor layer is a thin film as described above, a field-effect transistor formed here is also referred to as a thin film transistor. The semiconductor layer is preferably a crystalline semiconductor layer that is crystallized by heat treatment or energy beam irradiation with a laser beam or the like, after a semiconductor layer is formed by a vapor deposition method, a sputtering method, or the like. This is because when a crystalline semiconductor layer is formed, field-effect mobility of the field-effect transistor becomes 30 to 500 $cm^2/V \cdot sec$ (electron), which suppresses power loss.

The power supply control circuit 14 includes a semiconductor layer, an insulating layer, a layer for forming a wiring, and is preferably formed to have a thickness of 0.5 μm to 5 μm in total. When the power supply control circuit 14 is formed to have this thickness, the power supply control circuit 14 can contribute to reduction in thickness of the power storage device. Further, the power supply control circuit 14 can have resistance to bending stress. When the semiconductor layer is separated to be island-shaped semiconductor layers, resistance to bending stress can be improved.

The first structural body 10 and the second structural body 12 are fixed by an adhesive 28 so that the antenna terminal 18 and the through electrode 20 are electrically connected. For example, as the adhesive 28, an acrylic-based, urethane-based, or epoxy-based adhesive, in which conductive particles are dispersed, can be used. Alternatively, a connection portion of the antenna terminal 18 and the through electrode 20 may be fixed by a conductive paste or a solder paste and another part may be fixed by acrylic-based, urethane-based, or epoxy-based adhesive. Also, the second structural body 12 and the power supply control circuit 14 are fixed so that the through electrode 20 and the connection electrode 24 are electrically connected.

A sealant 30 is formed using an acrylic-based, urethane-based, phenol-based, epoxy-based, or silicone-based resin material and is preferably provided in order to protect the power supply control circuit 14. The sealant 30 is formed to cover the power supply control circuit 14 and to preferably cover side surfaces of the power supply control circuit 14 and the second structural body 12. When the sealant 30 is provided, the power supply control circuit 14 can be prevented from being damaged. Further, the adhesive strength between the power supply control circuit 14, the second structural body 12, and the first structural body 10 can be enhanced. In such a way, a power storage device with a thickness of 2 μm to 150 μm, preferably, 10 μm to 60 μm can be obtained.

Figure 3:
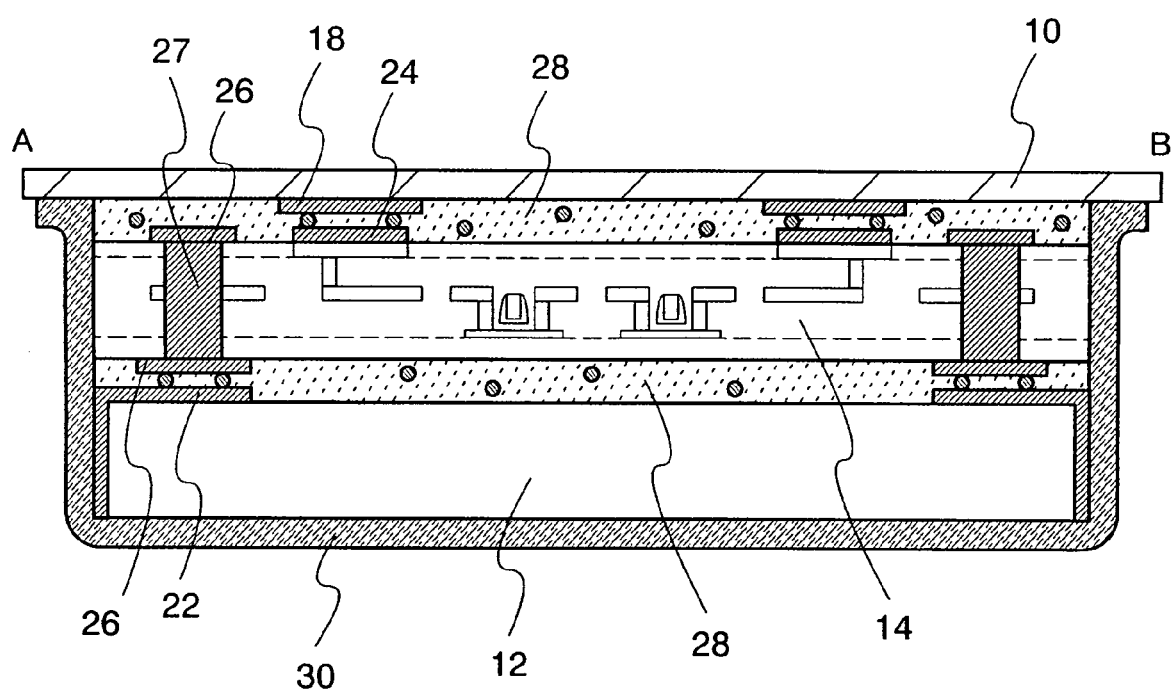
FIG. 3 is a cross-sectional view showing an example of a structure taken along a line A-B of FIG. 1.

FIG. 3 shows a structure in which the antenna terminal 18 of the first structural body 10 and the connection electrode 24 of the power supply control circuit 14 are located to face and be connected to each other. The second structural body 12 is located on a back side of the power supply control circuit 14 so as to protect the power supply control circuit 14. In a case where the second structural body 12 is provided with a capacitor, a ceramics antenna-connection electrode 27 may be formed in the power supply control circuit 14 so as to be electrically connected to a capacitor external electrode 22 of the second structural body 12. The first structural body 10, the second structural body 12, and the power supply control circuit 14 are preferably fixed by the adhesive 28. In a structure shown in FIG. 3, since the second structural body 12 is located on the back side of the power supply control circuit 14, the sealant 30 may be provided as appropriate.

As described above, according to the present invention, when the structural body formed of ceramics or the like is used, rigidity of the power storage device can be improved. Accordingly, even when the power storage device is thinned, durability and required functions can be maintained. When a wiring for connection is formed in the structural body formed of ceramics or the like and an antenna and a power supply control circuit are connected, malfunction caused by detachment of a connection portion can be prevented even when bending stress is applied.

EMBODIMENT 1

Figure 4A:
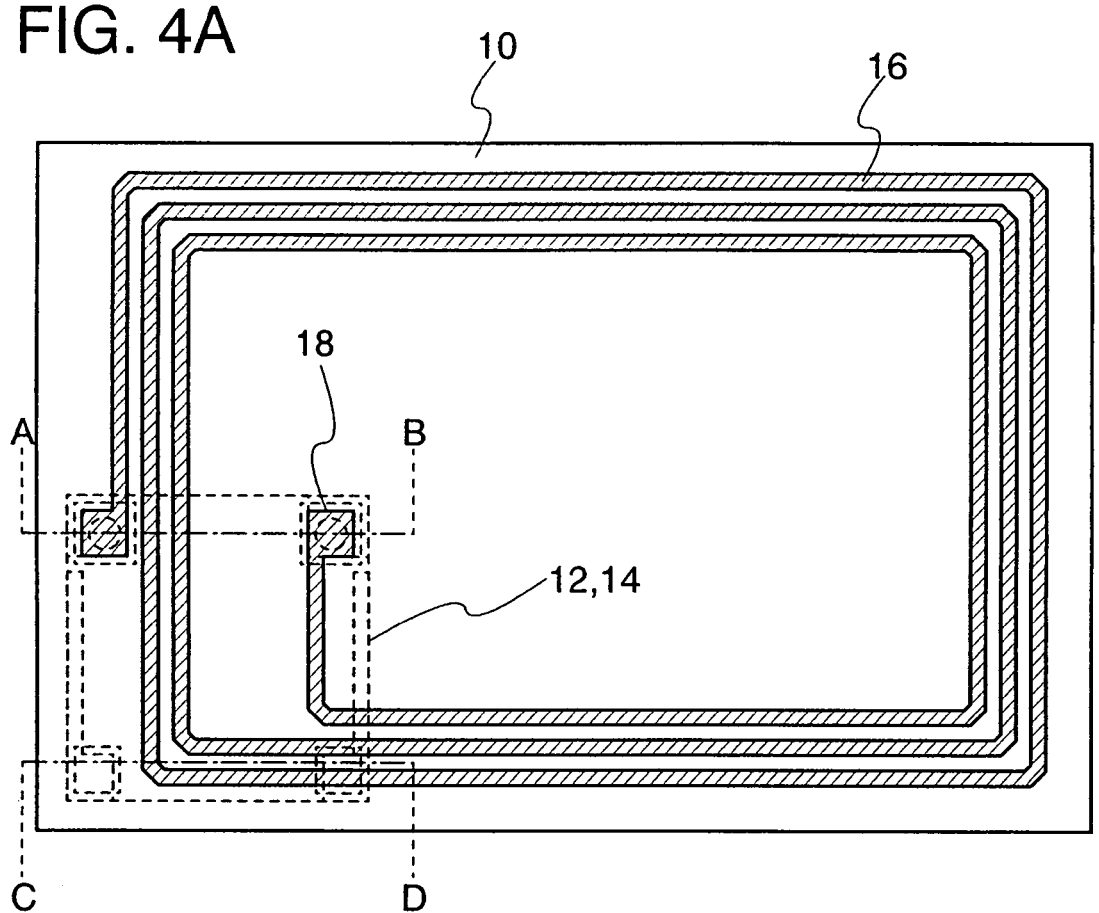
FIGS. 4A to 4C are plan views showing an example of a power storage device that includes a first structural body provided with an antenna, a second structural body provided with a capacitor, and a power supply control circuit.
Figure 4B:
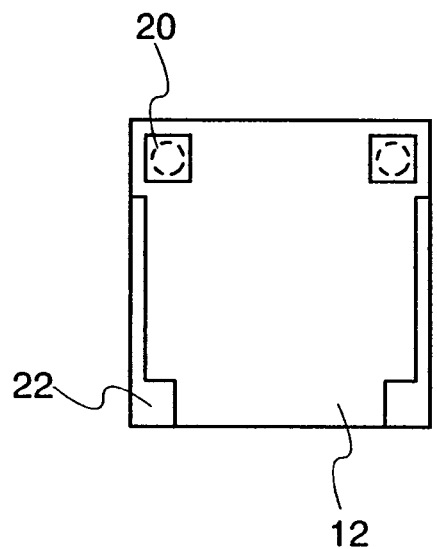
Figure 4C:
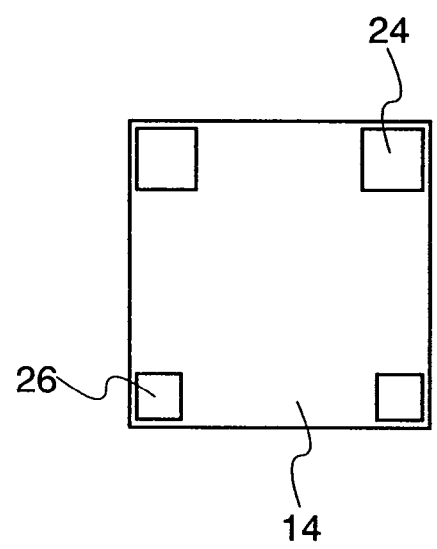
Figure 5A:
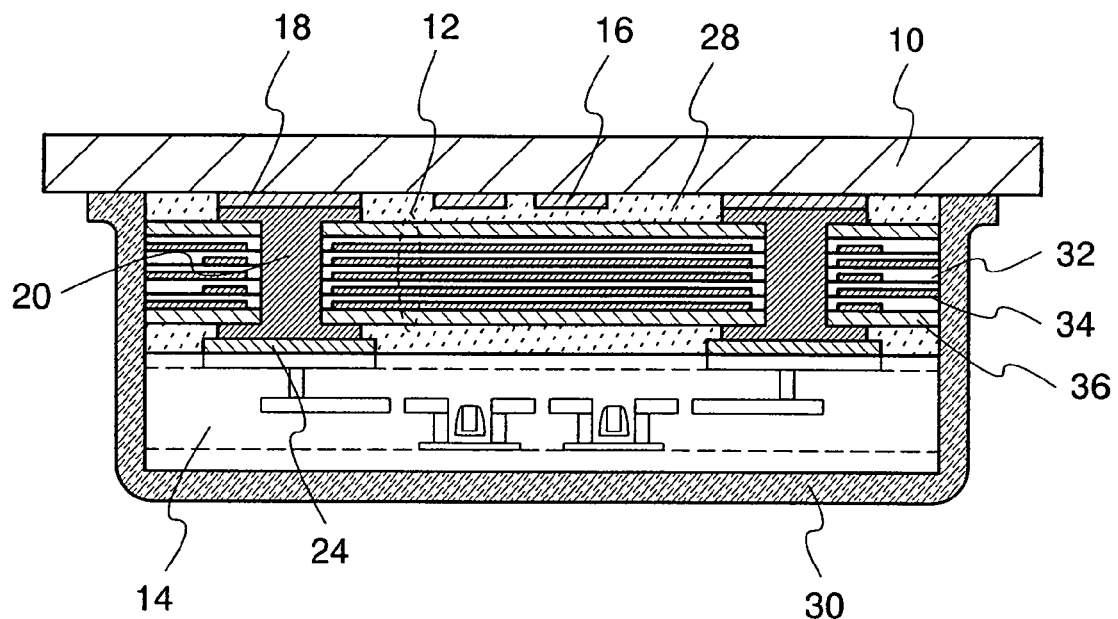
FIGS. 5A and 5B are cross-sectional views showing an example of a power storage device that includes a first structural body provided with an antenna, a second structural body provided with a capacitor, and a power supply control circuit.
Figure 5B:
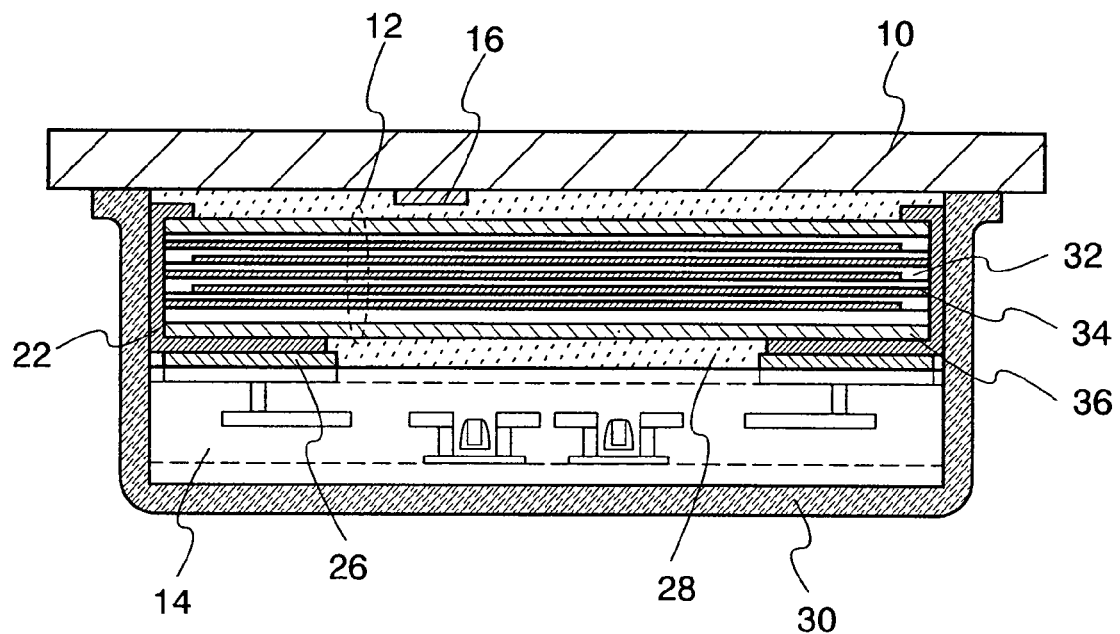

This embodiment will explain an example of a power storage device that includes a first structural body provided with an antenna, a second structural body provided with a capacitor, and a power supply control circuit 14, with reference to FIGS. 4A to 4C and FIGS. 5A and 5B. FIGS. 4A to 4C are plan views of the power storage device, and FIGS. 5A and 5B are cross-sectional views taken along lines A-B and C-D of FIG. 4A.

FIG. 4A shows a mode in which an antenna 16 having a coil-shape is formed in a first structural body 10. The first structural body 10 is formed using a plastic material such as PET (polyethylene terephthalate), PEN (polyethylene naphthalate), PES (polyethersulfone), polypropylene, polypropylene sulfide, polycarbonate, polyether imide, polyphenylene sulfide, polyphenylene oxide, polysulfone, polyphthalamide, acrylic, or polyimide, or an insulating material such as non-woven fabric, or paper.

The antenna 16 is formed in the first structural body 10 using a low resistance metal material such as copper, silver, or aluminum, by a printing method, a plating method, or the like. The antenna 16 shown in FIG. 4A has a coil-shape which is suitable when an electromagnetic induction method (for example, 13.56 MHz band) is employed. When a microwave method (for example, an UHF band (860 to 960 MHz band), 2.45 GHz band, or the like) is employed, a length and a shape of a conductive layer serving as antenna may be appropriately set in consideration of a wavelength of an electromagnetic wave that is used for transmitting signals. In this case, a monopole antenna, a dipole antenna, a patch antenna, and the like may be used.

FIG. 4A shows a mode in which a second structural body 12 and a power supply circuit 14 are provided in accordance with an antenna terminal 18. FIG. 4B is a plan view of the second structural body 12, and FIG. 4C is a plan view of the power control circuit 14. An outside dimension of the second structural body 12 and that of the power supply control circuit 14 are preferably almost the same. Alternatively, the outside dimension of the power supply control circuit 14 may be smaller than that of the second structural body 12.

In this embodiment, the second structural body 12 is preferably formed of a ceramic material. In this second structural body 12, a through electrode 20 and a capacitor electrode 34 are formed. In the power supply control circuit 14, a connection electrode 24 that is connected to the antenna terminal 18 and a capacitor-portion connection electrode 26 that is connected to the capacitor electrode 34 are formed. Subsequently, the details of a connection structure of the second structural body 12 and the power supply control circuit 14 is explained with reference to FIGS. 5A and 5B.

FIG. 5A is a cross-sectional view taken along a line A-B. The first structural body 10 and the power supply control circuit 14 are connected to each other by the through electrode 20 formed in the second structural body 12. They are fixed by an adhesive 28. In the second structural body 12, layers each including a dielectric layer 32 and the capacitor electrode 34 are stacked so as to be engaged with each other. A capacitor is formed by stacking the dielectric layer 32 and the capacitor electrode 34 in such a manner.

The dielectric layer 32 is formed by coating a surface of the substrate with a ceramics paste in which a ceramic material such as barium titanate ($BaTiO_3$), strontium titanate ($SrTiO_3$), or a Pb-based complex perovskites compound material contains a binder compound, a plasticizer, and an organic solvent. Then, an electrode paste selected from copper or a copper alloy, nickel or a nickel alloy, silver or a silver alloy, and tin or a tin alloy, is printed thereover to form the capacitor electrode 34. Note that when the through electrode 20 is formed, the dielectric layer and the capacitor electrode are formed to have an opening in a corresponding position where the through electrode 20 is formed. The dielectric layer and the capacitor electrode are dried, and then, cut into predetermined shapes. Then, the capacitor electrodes 34 are stacked to be engaged with each other. The stacked layers are interposed between protective layers 36 formed of a ceramic material or the like, the binder is removed, and baking and heating treatment are performed to form the capacitor.

In FIGS. 5A and 5B, the dielectric layer 32 and the capacitor electrode 34 can be formed to have a thickness of 1 to 10 μm by using nanoparticles. Accordingly, when five dielectric layers 32 each having a thickness of 2 μm are stacked, the thickness thereof is 10 μm. Further, even when ten dielectric layers 32 each having a thickness of 1 μm are stacked, the thickness thereof is not greater than 10 μm.

FIG. 5B is a cross-sectional view taken along a line C-D and shows a structure of the capacitor electrode 34 and the capacitor-portion connection electrode 26 of the power supply control circuit 14. In the second structural body 12, a capacitor external electrode 22, which is formed in an outer edge portion, is subjected to nickel plating, tin plating, and the like The adhesive 28 can be used for connecting the capacitor external electrode 22 and the capacitor-portion connection electrode 26.

As descried above, the power storage device that includes the first structural body 10 provided with an antenna, the second structural body 12 provided with a capacitor, and the power supply control circuit 14 can be obtained. When the second structural body 12 formed of ceramics or the like is used, rigidity of the power storage device can be improved. Accordingly, even when a power storage device including the power supply control circuit 14 is thinned, durability and required functions can be maintained.

EMBODIMENT 2

This embodiment will explain an example of a power storage device of the present invention provided with a plurality of antennas. An example of a power storage device will be explained with reference to FIGS. 6A to 6D and FIGS. 7A and 7B, which includes a first structural body 10 provided with an antenna, a second structural body 12 provided with a capacitor, a power supply control circuit 14, and a ceramics antenna 38. FIGS. 6A to 6D are plan views of the power storage device, and FIGS. 7A and 7B are cross-sectional views taken along lines E-F and G-H.

Figure 6A:
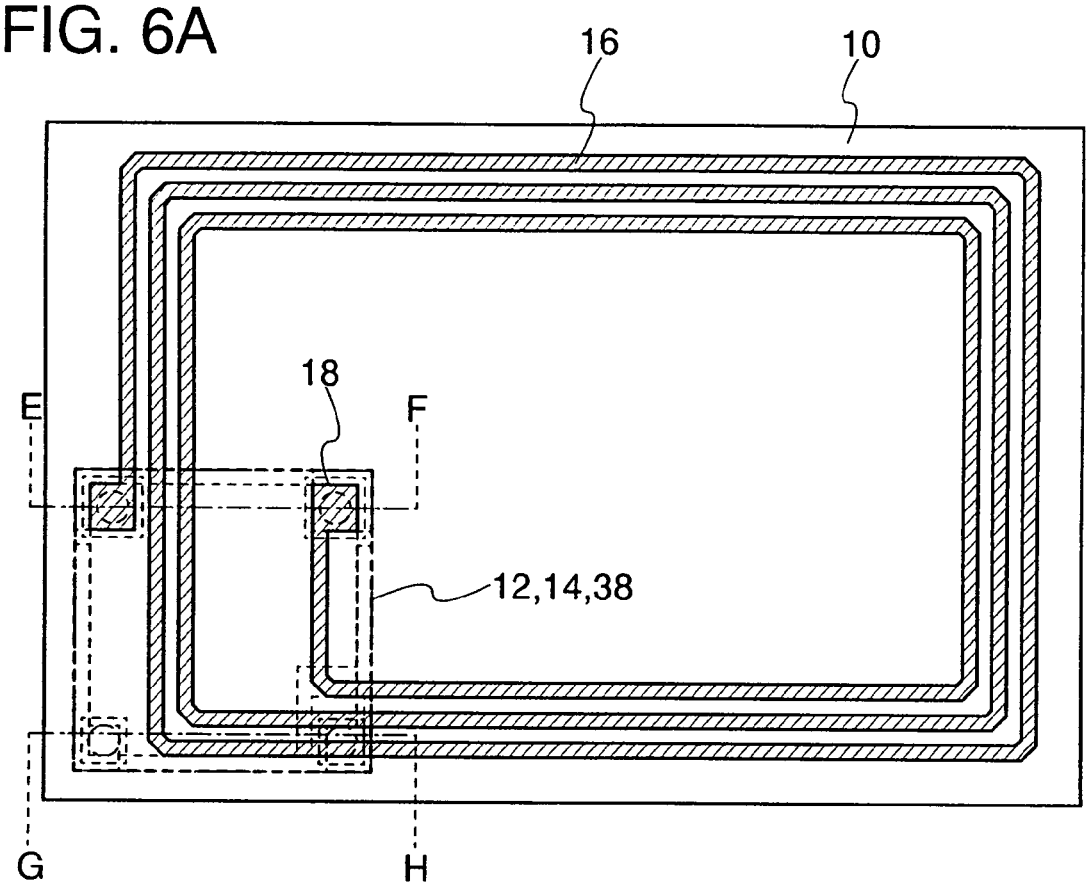
FIGS. 6A to 6D are plan views showing an example of a power storage device that includes a first structural body provided with an antenna, a second structural body provided with a capacitor, a power supply control circuit, and a ceramics antenna.
Figure 7A:
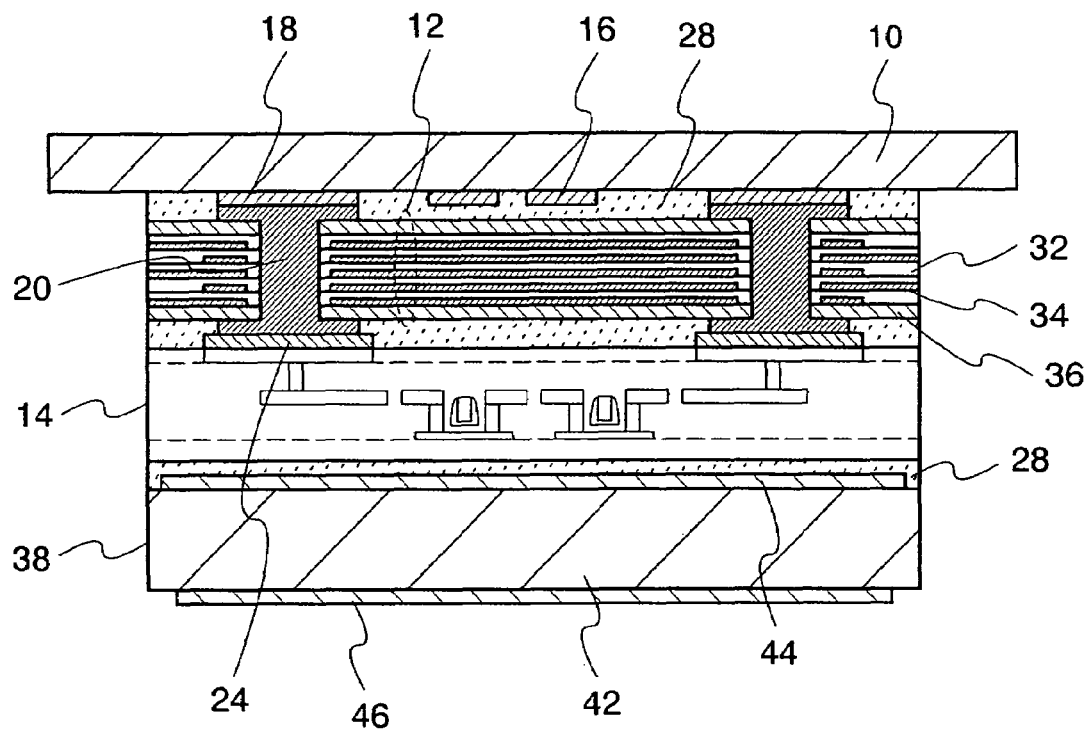
FIGS. 7A and 7B are cross-sectional views showing an example of a power storage device that includes a first structural body provided with an antenna, a second structural body provided with a capacitor, a power supply control circuit, and a ceramics antenna.
Figure 7B:
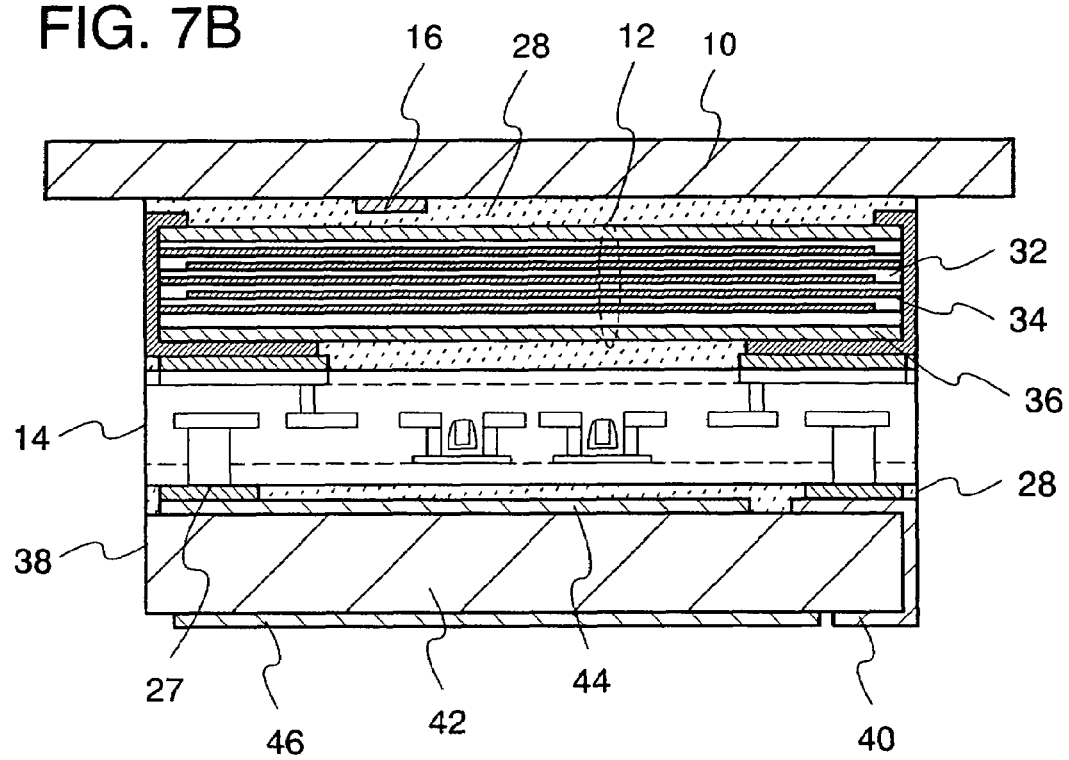

In FIG. 6A, an antenna 16 having a coil-shape is formed in the first structural body 10. The shape of the antenna 16 may be appropriately set in accordance with a frequency band that is used for communication, similarly to in Embodiment 1.

Figure 6B:
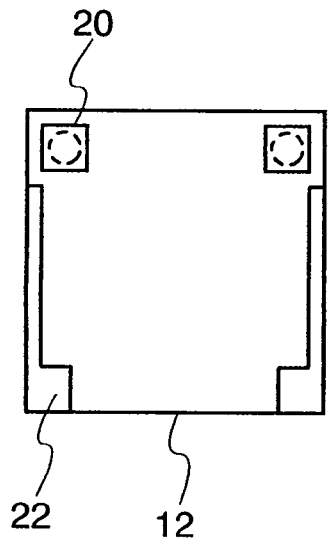
Figure 6C:
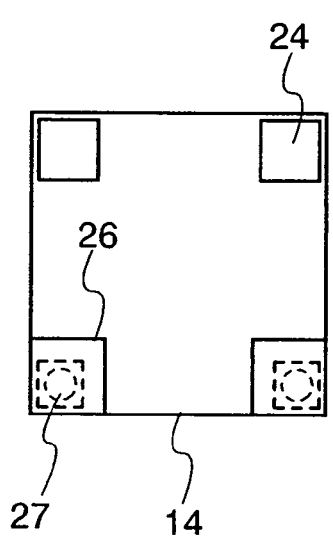
Figure 6D:
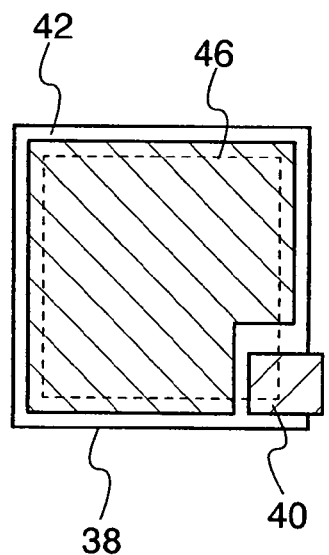

FIG. 6A shows a mode in which the second structural body 12, the power supply control circuit 14, and the ceramics antenna 38 are provided in accordance with an antenna terminal 18. FIG. 6B is a plan view of the second structural body 12, FIG. 6C is a plan view of the power supply control circuit 14, and FIG. 6D is a plan view of the ceramics antenna 38. Outside dimensions of the second structural body 12, the power supply control circuit 14, and the ceramics antenna 38 are preferably almost the same. Alternatively, the outside dimension of the power supply control circuit 14 may be smaller than those of the second structural body 12 and the ceramics antenna 38.

In the second structural body 12 that is formed of a ceramic material, a through electrode 20 and a capacitor external electrode 22 are formed. In the power supply control circuit 14, a connection electrode 24 that is connected to the antenna terminal 18, a capacitor-portion connection electrode 26 that is connected to the capacitor external electrode 22, and a ceramics antenna-connection electrode 27 that is connected to the ceramics antenna 38 are formed. Subsequently, the details of connection structures of the second structural body 12 and the power supply control circuit 14 are explained with reference to FIGS. 7A and 7B.

FIG. 7A is a cross-sectional view taken along a line E-F. In the second structural body 12, a capacitor is formed using a ceramic material, similarly to Embodiment 1. The structure including the through electrode 20 that connects the antenna terminal 18 of the first structural body 10 and the connection electrode 24 of the power supply control circuit 14, is similar to that of FIG. 5A. The ceramics antenna 38 is located on the back side of the power supply control circuit 14. The second structural body 12 and the ceramics antenna 38, sandwiching the power supply control circuit 14, have a function for a protective layer.

FIG. 7B is a cross-sectional view taken along a line G-H and shows a connection structure between the power supply control circuit 14 and the ceramics antenna 38. The ceramics antenna 38 includes a ground body 44 on one side of a dielectric substance 42 (the power supply control circuit 14 side) and a reflector 46 on the other side. The power supply control circuit 14 is provided with the ceramics antenna-connection electrode 27 to which the ground body 44 and a power feeding body 40 are connected. The reflector 46 may have a slit to enhance directivity. The reflector 46 and the power feeding body 40 are provided with a gap therebetween and are capacitive coupled.

In the power storage device of this embodiment, the antenna 16 formed in the first structural body 10 and the ceramics antenna 38 are used as an antenna for power feeding, and the power is stored in the capacitor formed in the second structural body 12. The capacitor includes dielectric layers 32 and capacitor electrodes 34. Large capacitance can be obtained by stacking a plurality of dielectric layers 32 and capacitor electrodes 34. In this case, frequencies of an electromagnetic wave received at the antenna 16 and the ceramics antenna 38 are varied, whereby the capacitor can be efficiently charged. In other words, a band of the electromagnetic wave received for charging the capacitor can be extended. In this case, the dielectric layer 32 and the capacitor electrode 34 can be formed to have a thickness of 1 to 10 μm by using nanoparticles. Accordingly, when five dielectric layers 32 each having a thickness of 2 μm are stacked, the thickness thereof is 10 μm. Further, even when ten dielectric layers 32 each having a thickness of 1 μm are stacked, the thickness thereof is not greater than 10 μm.

As described above, the power storage device including the first structural body 10 provided with an antenna, the second structural body 12 provided with a capacitor, the power supply control circuit 14, and the ceramics antenna 38 can be obtained. When the second structural body 12 formed of ceramics or the like and the ceramics antenna 38 are used, rigidity of the power storage device can be improved. Accordingly, even when a power storage device including the power supply control circuit 14 is thinned, durability and required functions can be maintained.

EMBODIMENT 3

An example of a power supply control circuit of a power storage device of the present invention will be explained with the use of a block diagram shown in FIG. 8.

Figure 8:
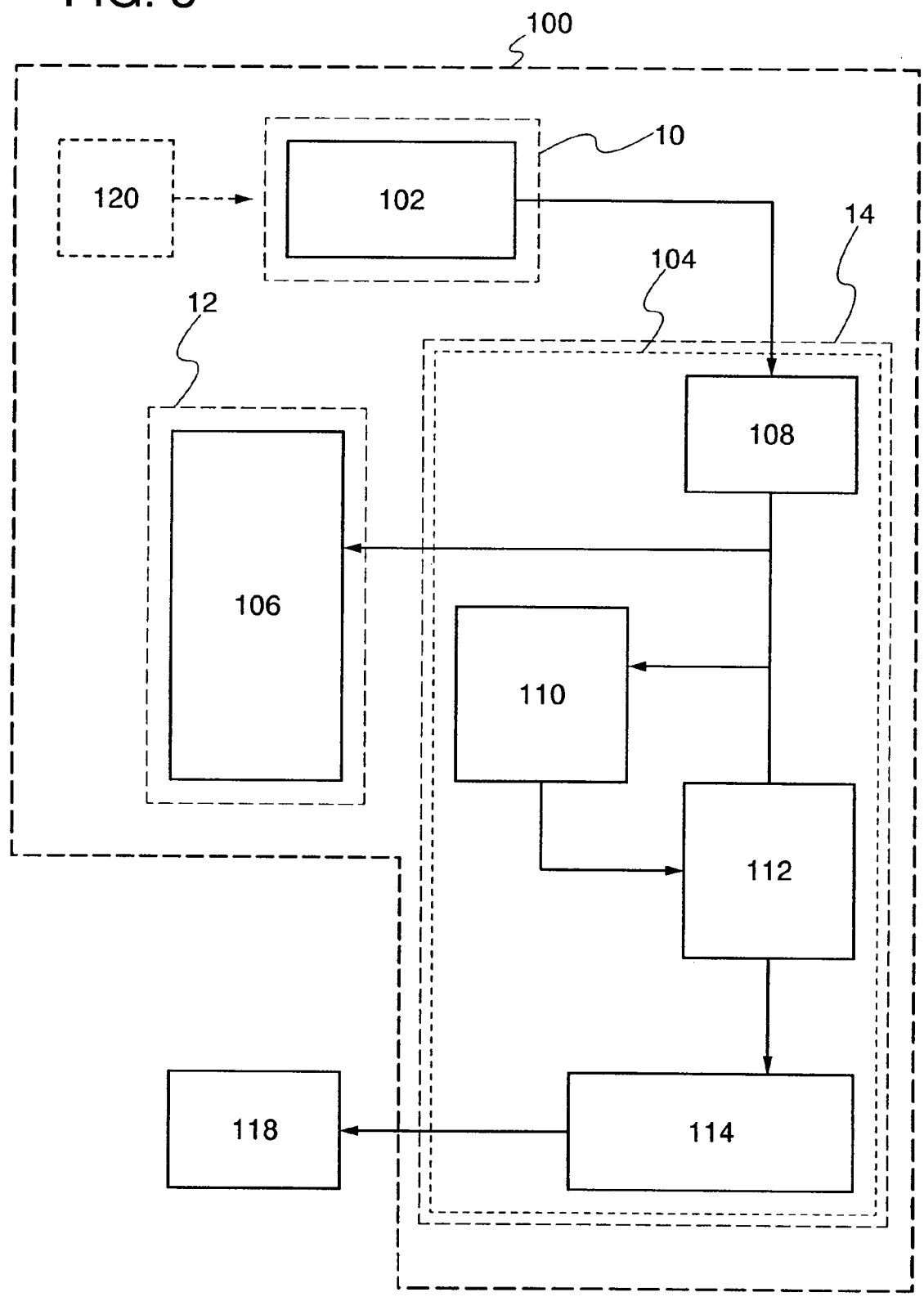
FIG. 8 is a view showing an example of a power supply control circuit in a power storage device.

A power storage device 100 of FIG. 8 includes an antenna 102, a power supply control circuit 104, and a capacitor 106. The power supply control circuit 104 includes a rectifier circuit 108, a low-frequency signal generation circuit 110, a switching circuit 112, and a power supply circuit 114. Power is output from the power supply circuit in the power supply control circuit to a load 118 on the outside of the power storage device.

The antenna 102 is formed in the first structural body 10 in accordance with Embodiment 1. The capacitor 106 is formed in the second structural body 12. The power supply control circuit 104 corresponds to the power supply control circuit 14.

A structure of the load 118 in FIG. 8 is different depending on electronic devices. For example, in the cellular phones and the digital video cameras, a logic circuit, an amplifier circuit, a memory controller, and the like correspond to a load. Also, in IC cards, IC tags, and the like, a high-frequency circuit, a logic circuit, and the like correspond to a load.

Further, FIG. 8 is the power storage device 100 having a structure in which an electromagnetic wave supplied by a power feeder 120 is received at the antenna 102 and stored in the capacitor 106. In FIG. 8, the electromagnetic wave received at the antenna 102 is rectified at the rectifier circuit 108 and stored in the capacitor 106. Power obtained by receiving the electromagnetic wave at the antenna 102 is input to the low-frequency signal generation circuit 110 through the rectifier circuit 108. Further, power obtained by receiving the electromagnetic wave at the antenna 102 is input to the power supply circuit 114 through the rectifier circuit 108 and the switching circuit 112 as a signal. The low-frequency signal generation circuit 110 outputs an on/off control signal to the switching circuit 112 when operation of the low-frequency signal generation circuit 110 is controlled by the input signal.

In FIG. 8, the power obtained by receiving the electromagnetic wave is stored in the capacitor 106. When the power is not sufficiently supplied from the power feeder 120, power supplied from the capacitor 106 is supplied to the power supply circuit 114 through the switching circuit 112. The power feeder 120 is a device for emitting an electromagnetic wave that can be received at the antenna 102.

A structure of the antenna 102 in FIG. 8 may be selected from an electromagnetic coupling method, an electromagnetic induction method, a micro-wave method or the like, depending on a frequency band of the electromagnetic wave that is received. The antenna 102 can arbitrarily receive an electromagnetic wave and supply a signal to the power supply control circuit 104, regardless of whether or not an electromagnetic wave supplied by the power feeder 120 exists. For example, an electromagnetic wave of a cellular phone (800 to 900 MHz band, 1.5 GHz, 1.9 to 2.1 GHz band, or the like), an electromagnetic wave oscillated from the cellular phone, an electromagnetic wave of a radio wave clock (40 kHz or the like), noise of a household AC power supply (60 Hz or the like), electromagnetic waves that are randomly generated from other wireless signal output means, and the like can be utilized as an electromagnetic wave received at the antenna 102 in order to be stored in the capacitor 106 of the power storage device 100.

Next, operation for charging the capacitor 106 and supplying power to the power supply circuit 114 by receiving an electromagnetic wave in the power storage device 100 of FIG. 8 will be explained. The electromagnetic wave received at the antenna 102 is half-wave rectified and smoothed by the rectifier circuit 108. Then, the power output from the rectifier circuit 108 is supplied to the power supply circuit 114 through the switching circuit 112, and surplus power is stored in the capacitor 106.

In the power storage device 100 of this embodiment, by intermittently operating the power storage device 100 depending on strength of the electromagnetic wave, it is attempted that power stored in the capacitor 106 is not consumed wastefully. Although the power storage circuit generally supplies continuous power to a load, continuous power is not always necessary to be supplied depending on use application. In such a case, operation of supplying power from the power storage device 100 is stopped, whereby consumption of the power stored in the capacitor 106 can be suppressed. In this embodiment, only the low-frequency signal generation circuit 110 in FIG. 8 operates continuously. The low-frequency signal generation circuit 110 operates based on the power stored in the capacitor 106. An output waveform of the low-frequency signal generation circuit 110 is explained with reference to FIG. 9.

Figure 9:
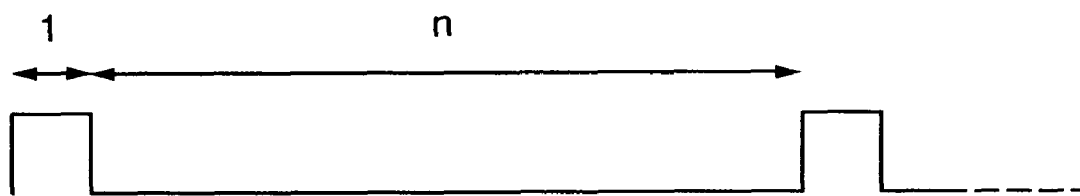
FIG. 9 is a view showing an output waveform of a low-frequency signal generation circuit.

FIG. 9 shows a waveform of a signal that is output from the low-frequency signal generation circuit 110 to the switching circuit. In an example of FIG. 9, a duty ratio of the output waveform is set 1:n (n is an integer) so that power consumption can be set approximately $1/(n+1)$. The switching circuit 112 is driven in accordance with this signal. The switching circuit 112 connects the capacitor 106 and the power supply circuit 114 only during a period where the output signal is high; therefore, power is supplied to a load through the power supply circuit from a battery in the power storage device only during the period.

Figure 10:
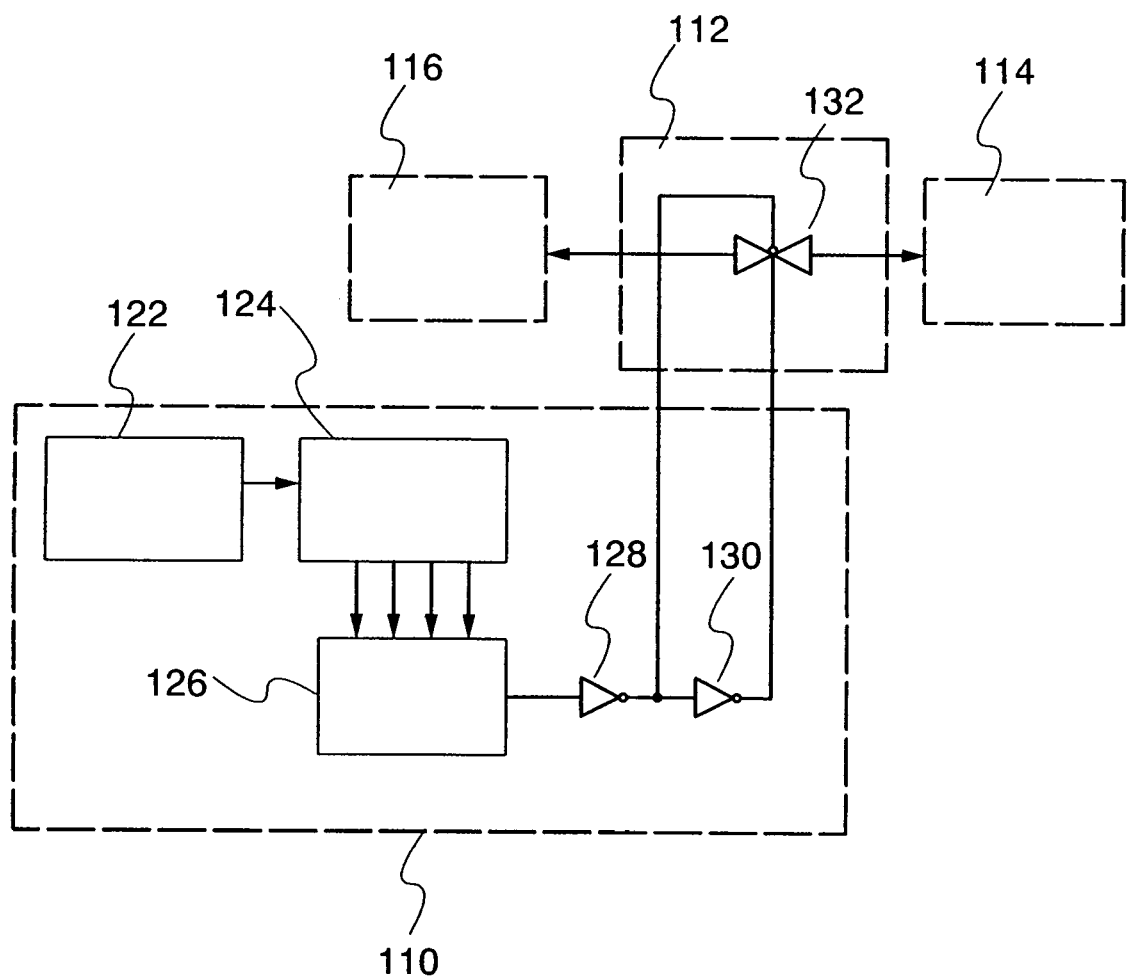
FIG. 10 is a view showing a structure of a low-frequency signal generation circuit of a power supply control circuit in a power storage device.

FIG. 10 shows an example of the low-frequency signal generation circuit 110 of FIG. 8. The low-frequency signal generation circuit 110 in FIG. 10 includes a ring oscillator 122, a frequency-divider circuit 124, an AND circuit 126, and inverters 128 and 130. An oscillation signal of the ring oscillator 122 is frequency-divided with the frequency-divider circuit 124 and the output thereof is input into the AND circuit 126 to generate a low-duty ratio signal with the AND circuit 126. Further, the output of the AND circuit 126 is input to a switching circuit 112 including a transmission gate 132 through the inverters 128 and 130. The ring oscillator 122 oscillates with a low frequency, and oscillation is performed at 1 kHz, for example.

Figure 11:
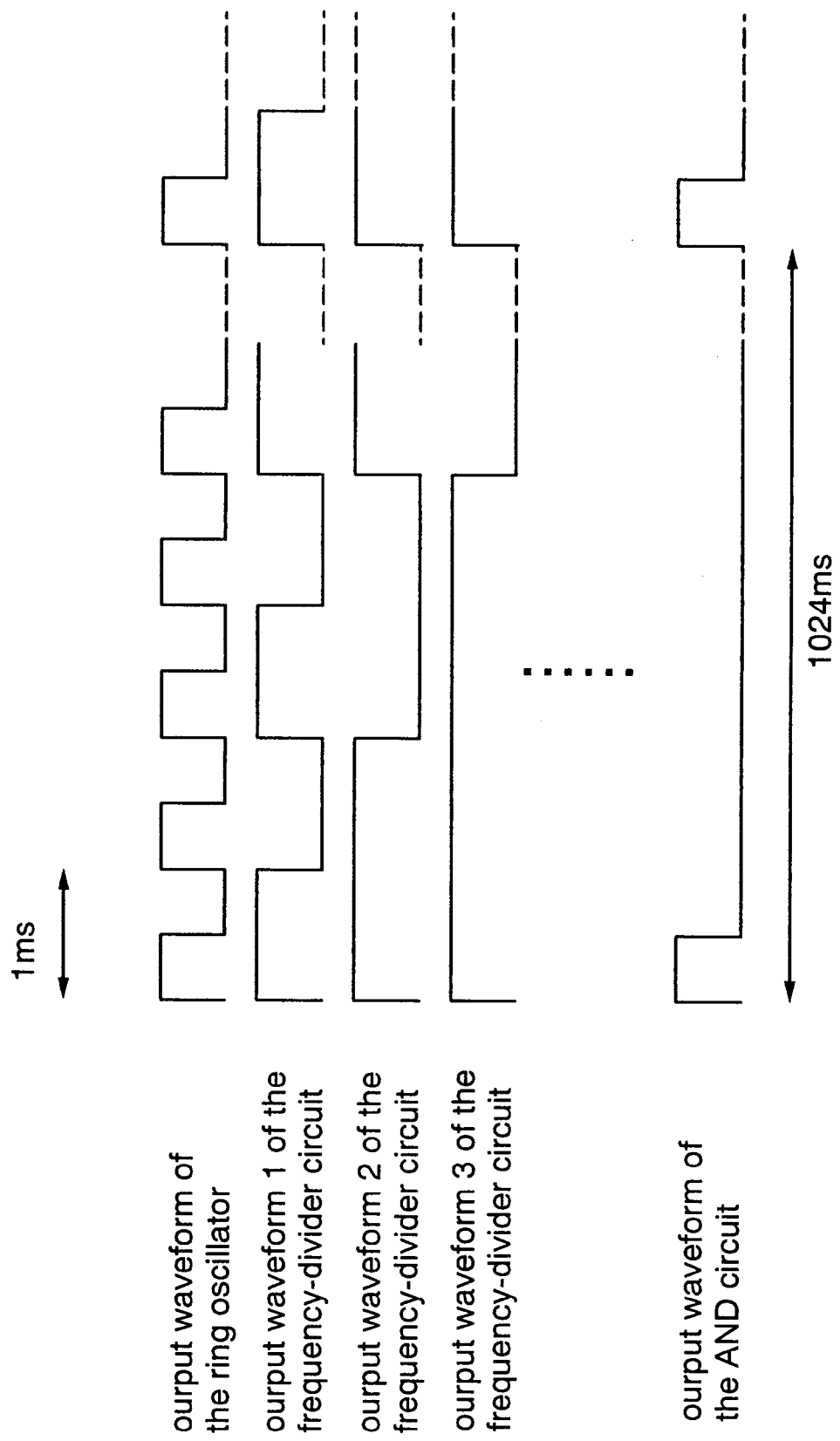
FIG. 11 is a timing chart of a signal output from the low-frequency signal generation circuit shown in FIG. 10.

FIG. 11 is a timing chart of a signal output from the low-frequency signal generation circuit 110 shown in FIG. 10. FIG. 11 shows an example of an output waveform of the ring oscillator 122, an output waveform of the frequency-divider circuit 124, and an output waveform of the AND circuit 126. In FIG. 11, an output waveform is shown, in which a signal output from the ring oscillator 122 is frequency-divided, where the number of division is 1024. As the output waveform, a frequency-divider circuit output waveform 1, a frequency-divider circuit output waveform 2, and a frequency-divider circuit output waveform 3 are sequentially output. When these output waveforms are processed with the AND circuit 126, a signal with a duty ratio of 1:1024 can be formed. As long as the oscillation frequency of the ring oscillator 122 is 1 KHz at this time, an operation period is 0.5 μsec, and a non-operation period is 512 μsec in one cycle.

The signal output from the low-frequency signal generation circuit 110 regularly controls on/off of the transmission gate 132 of the switching circuit 112 and controls supply of the power from the capacitor 106 to the power supply circuit 114. Therefore, supply of the power from the power storage device 100 to the load can be controlled. In other words, the power is intermittently supplied from the capacitor 106 to a signal control circuit portion, whereby supply of the power from the power storage device 100 to the load 118 can be suppressed, and low power consumption can be achieved.

An example of the power supply circuit 114 in FIG. 8 is explained with reference to FIG. 12. The power supply circuit 114 comprises a reference voltage circuit and a buffer amplifier. The reference voltage circuit includes a resistor 134, and transistors 136 and 138 that are diode-connected. In this circuit, a reference voltage (2×Vgs) corresponding to a voltage between a gate and a source (Vgs) of the transistor is generated by the transistors 136 and 138. The buffer amplifier includes a differential circuit that includes transistors 140 and 142, a current mirror circuit that includes transistors 144 and 146, a current supply resistor 148, and a common source amplifier that includes a transistor 150 and a resistor 152.

Figure 12:
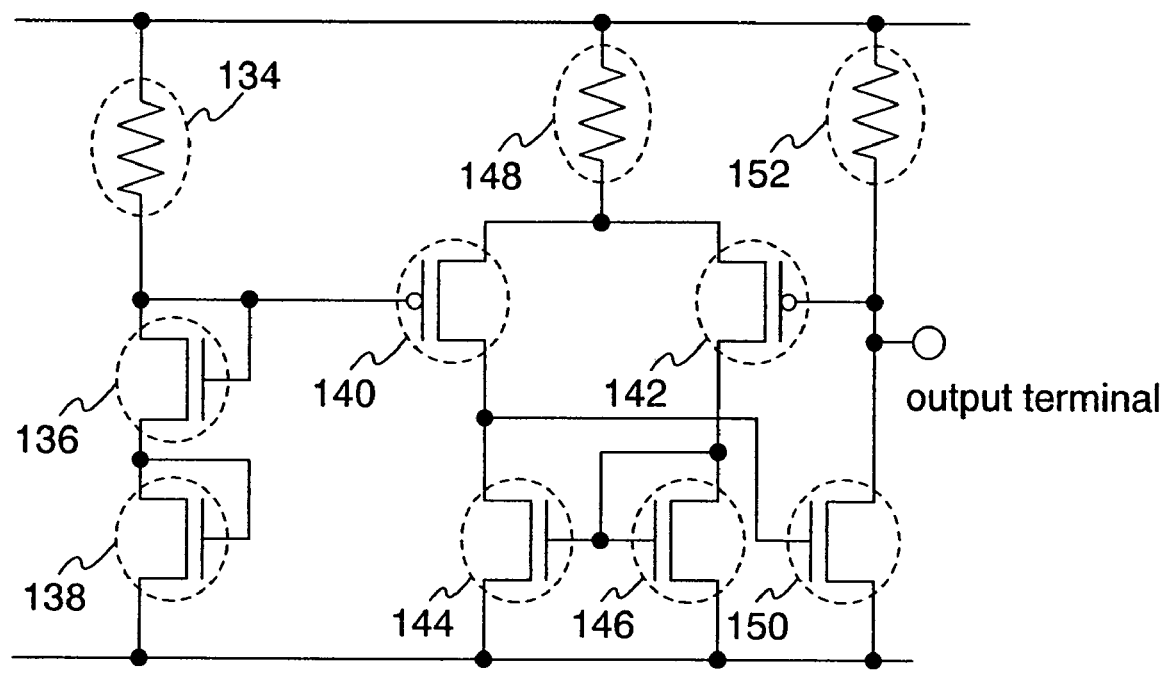
FIG. 12 is a diagram showing a structure of a power supply circuit of a power supply control circuit in a power storage device.

The power supply circuit 114 shown in FIG. 12 operates in such a manner that when a large amount of current is output from an output terminal, the amount of current that flows through the transistor 150 becomes small, whereas when a small amount of current is output from the output terminal, the amount of current that flows through the transistor 150 becomes large. Thus, a current that flows through the resistor 152 is almost constant. In addition, the potential of the output terminal is almost the same as that of the reference voltage circuit. Here, although the power supply circuit including the reference voltage circuit and the buffer amplifier is shown, the power supply circuit 114 is not limited to the structure in FIG. 12, and a power supply circuit with a different structure may be used.

As described above, the power supply control circuit of this embodiment can be applied to the power storage device of Embodiment 1. According to the power supply control circuit of this embodiment, an electromagnetic wave can be received and used as power to be stored in the capacitor. The power stored in the capacitor 106 can be supplied to a load. In addition, supply of the power from the power storage device to the load can be controlled. In other words, the power is intermittently supplied from the capacitor to the signal control circuit portion, whereby supply of the power from the power storage device to the load is suppressed, and power consumption can be reduced.

EMBODIMENT 4

Figure 13:
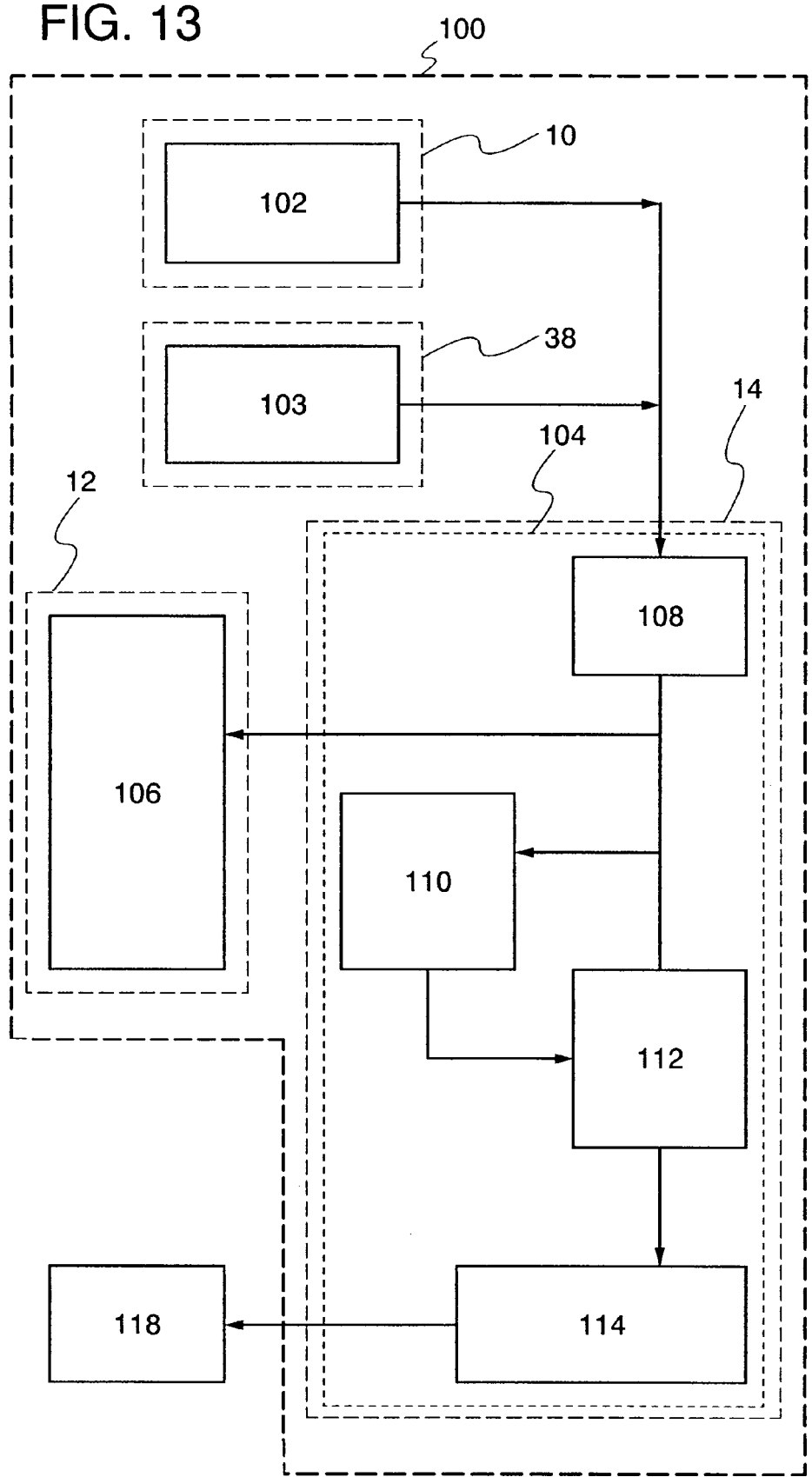
FIG. 13 is a view showing a structure of a power storage device provided with a plurality of antennas.

This embodiment will explain an example of a power storage device corresponding to Embodiment 2 with reference to FIG. 13. Note that different points from FIG. 8 will be mainly explained below.

A structure of a power storage device provided with a plurality of antenna circuits is shown in FIG. 13. An antenna 102 and a second antenna 103 are provided as the plurality of antenna circuits, which is different point from FIG. 8. The antenna 102 and the second antenna 103 are preferably formed so that compatible reception frequencies are different from each other. For example, the antenna 102 can formed of a spiral antenna as shown in FIG. 6A of Embodiment 2, and the second antenna 103 can be formed of a ceramics antenna (patch antenna).

The antenna 102 is formed in the first structural body 10 in accordance with Embodiment 2. The second antenna 103 corresponds to the ceramics antenna 38. A capacitor 106 is formed in the second structural body 12. A power supply control circuit 104 corresponds to the power supply control circuit 14.

Electromagnetic waves received at the antenna 102 and the second antenna 103 are rectified at a rectifier circuit 108 and stored in the capacitor 106. In the rectifier circuit 108, the electromagnetic waves received at both antennas can be rectified concurrently and stored in the capacitor 106. Alternatively, one of the electromagnetic waves received at the antenna 102 and the second antenna 103, which has stronger field intensity than the other, may be preferentially rectified at the rectifier circuit 108 to be stored in the capacitor 106.

Another structure of the power storage device 100 in this embodiment is the same as that of FIG. 8, and a similar operation effect can be obtained.

EMBODIMENT 5

This embodiment shows a power storage device having a function for controlling supply of power that is stored in a capacitor. Note that the portion having a similar function as that shown in Embodiment 3 is denoted by the same reference numeral to explain this embodiment.

Figure 14:
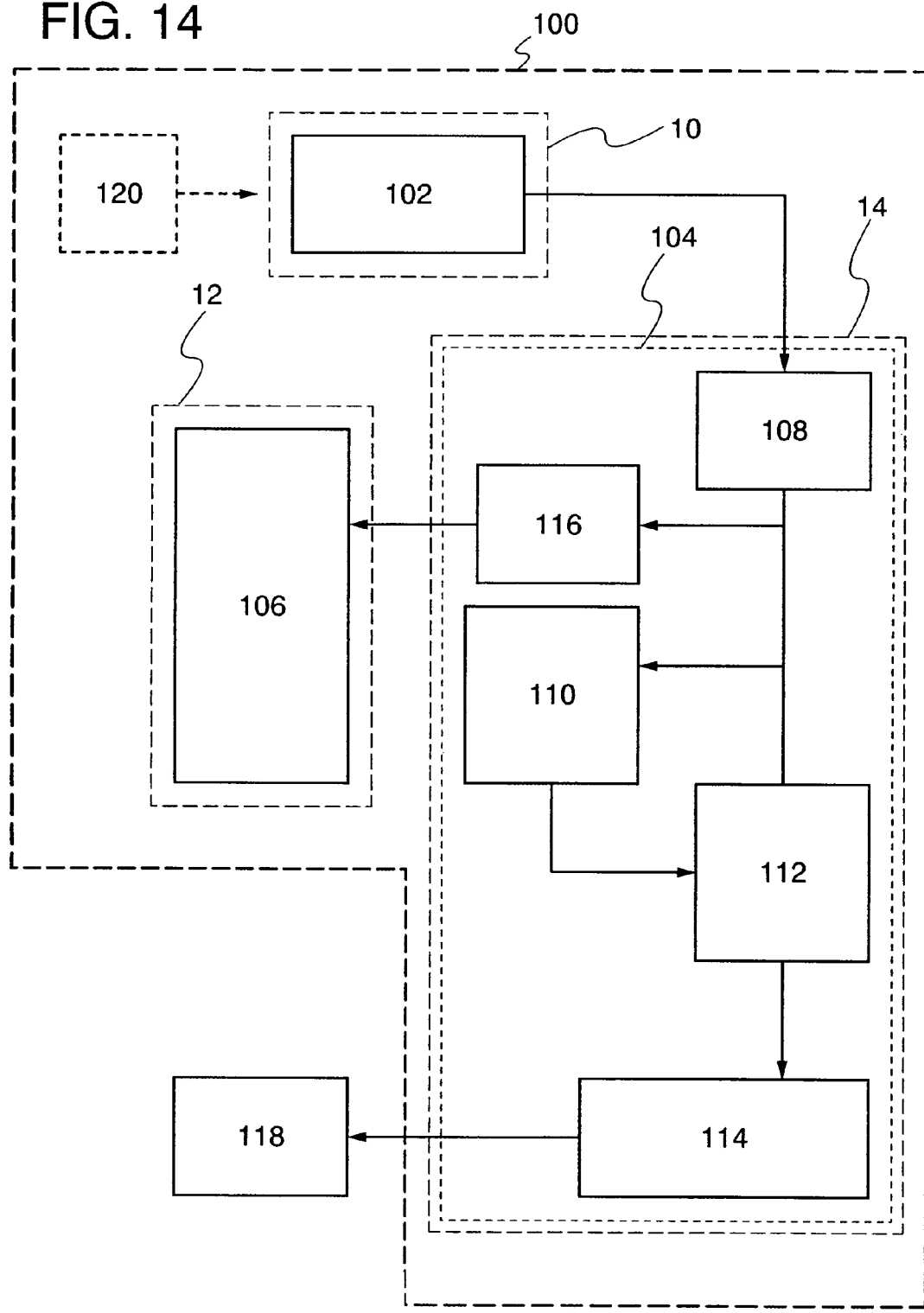
FIG. 14 is a view showing a structure of a power storage device having a function of controlling supply of power stored in a capacitor.

A power storage device 100 of FIG. 14 includes an antenna 102, a power supply control circuit 104, and a capacitor 106. The power supply control circuit 104 includes a rectifier circuit 108, a control circuit 116, a low-frequency signal generation circuit 110, a switching circuit 112, and a power supply circuit 114. Power is supplied from the power supply circuit 114 to a load 118.

The antenna 102 is formed in the first structural body 10 in accordance with Embodiment 1. The capacitor 106 is formed in the second structural body 12. The power supply control circuit 104 corresponds to the power supply control circuit 14.

In the power storage device of this embodiment, when power output from the rectifier circuit 108 exceeds power consumption of the load 118, the power supply control circuit 104 stores the excess power in the capacitor 106. Alternatively, when power that is output from the rectifier circuit 108 is insufficient for power consumption of the load 118, the power supply control circuit 104 discharges the capacitor 106 so that power is supplied to the power supply circuit 114. In FIG. 14, a control circuit 116 at the subsequent stage of the rectifier circuit 108 is provided for performing such operation.

Figure 15:
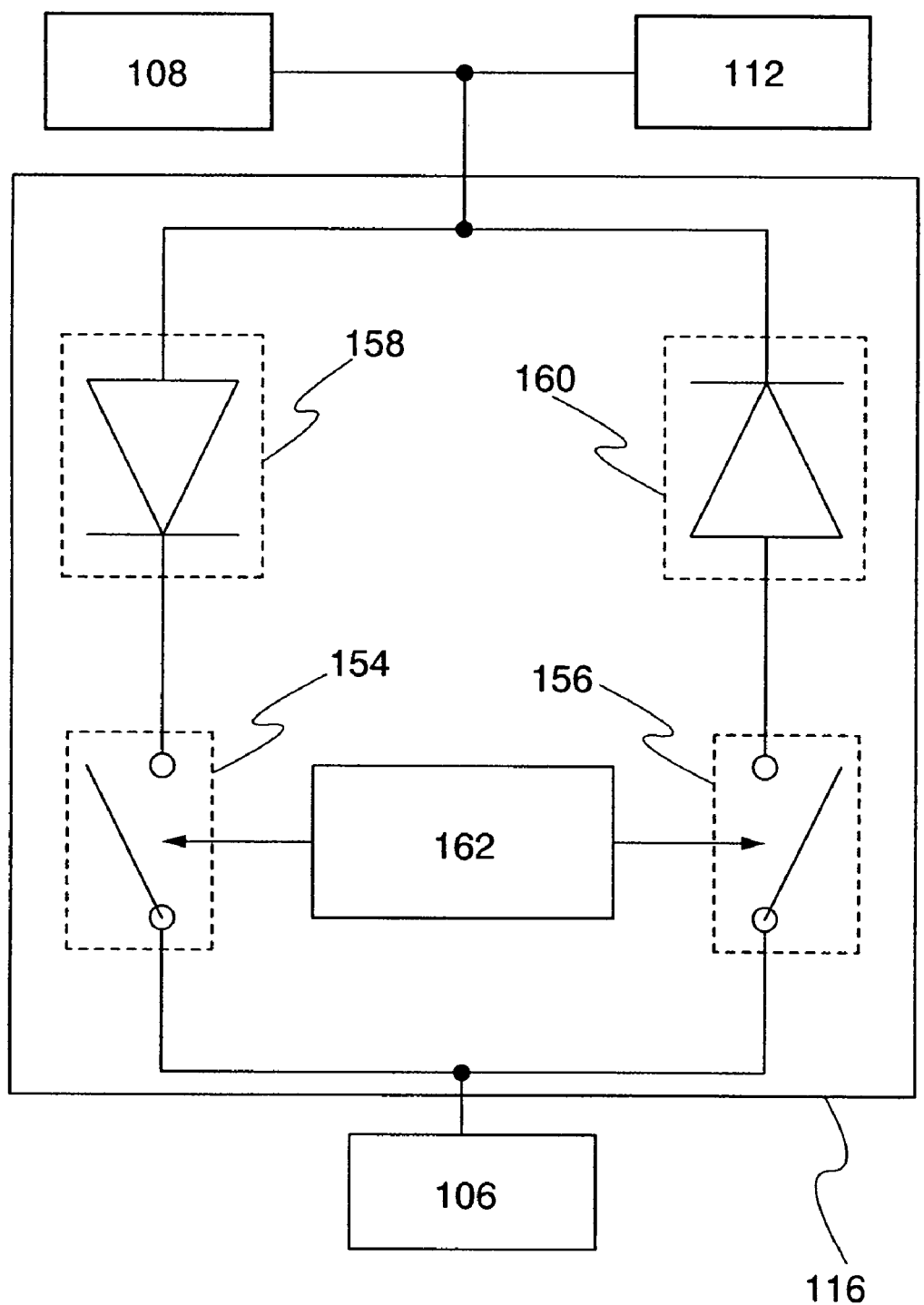
FIG. 15 is a view showing a structure of a control circuit of a power supply control circuit in a power storage device.

In FIG. 15, an example of the control circuit 116 is shown. The control circuit 116 includes switches 154 and 156, rectifier elements 158 and 160, and a voltage comparator circuit 162. In FIG. 15, the voltage comparator circuit 162 compares a voltage output from the capacitor 106 with a voltage output from the rectifier circuit 108. When a voltage output from the rectifier circuit 108 is sufficiently higher than a voltage output from the capacitor 106, the voltage comparator circuit 162 turns the switch 154 on and turns the switch 156 off. In such a condition, a current flows in the capacitor 106 from the rectifier circuit 108 through the rectifier element 158 and the switch 154. On the other hand, when a voltage output from the rectifier circuit 108 is insufficient as compared with a voltage output from the capacitor 106, the voltage comparator circuit 162 turns the switch 154 off and turns the switch 156 on. At this time, when a voltage output from the rectifier circuit 108 is higher than a voltage output from the capacitor 106, a current does not flow in the rectifier element 160; however, when a voltage output from the rectifier circuit 108 is lower than a voltage output from a battery, a current flows in the switch circuit 112 from the capacitor 106 through the switch 156 and the rectifier element 160.

Figure 16:
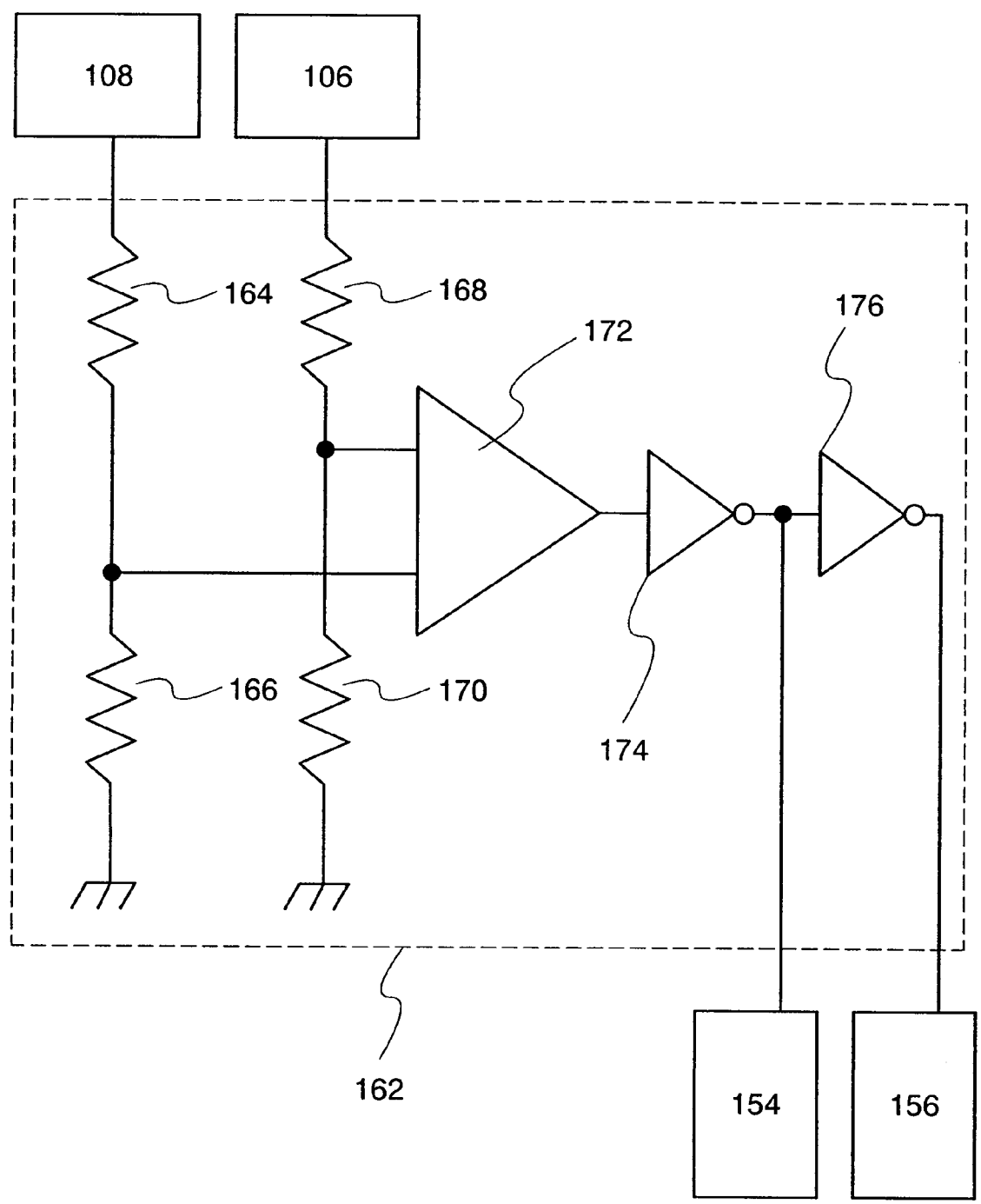
FIG. 16 is a view showing a structure of a voltage-comparing circuit of a power supply control circuit in a power storage device.

FIG. 16 shows a structure of the voltage comparator circuit 162. In the structure shown in FIG. 16, the voltage comparator circuit 162 divides the voltage output from the capacitor 106 with resistor elements 164 and 166, and divides the voltage output from the rectifier circuit 108 with resistor elements 168 and 170. Then, the voltage comparator circuit 162 inputs the divided voltage into a comparator 172. Inverter-type buffer circuits 174 and 176 are connected in series by an output of the comparator 172. Then, an output of the buffer circuit 174 is input to a control terminal of the switch 154, and an output of the buffer circuit 176 is input to a control terminal of the switch 156, whereby on/off of the switches 154 and 156 is controlled. For example each of the switches 154 and 156 is turned on when an output of the buffer circuit 174 or 176 is at the high potential ("H" level), and each of the switches 154 and 156 is turned off when an output of the buffer circuit 174 or 176 is at the low potential ("L" level). In such a manner, each voltage of the capacitor 106 and the rectifier circuit 108 is divided with the resistor to be input into the comparator 172, whereby on/off of the switches 154 and 156 can be controlled.

Note that the control circuit 116 and the voltage comparator circuit 162 are not limited to the above structure, and other types of control circuits and voltage comparator circuits may be used as long as they have various functions.

Operation of the power storage device 100 shown in FIG. 14 is generally as follows. First, an external wireless signal received at the antenna 102 is half-waved rectified by the rectifier circuit 108 and then smoothed. Then, a voltage output from the capacitor 106 and a voltage output from the rectifier circuit 108 are compared at the control circuit 116. When the voltage output from the rectifier circuit 108 is sufficiently higher than the voltage output from the capacitor 106, the rectifier circuit 108 is connected to the capacitor 106. At this time, power output from the rectifier circuit 108 is supplied to the capacitor 106 and the power supply circuit 114, and surplus power is stored in the capacitor 106.

The control circuit 116 compares the output voltage of the rectifier circuit 108 with the output voltage of the capacitor 106. When the output voltage of the rectifier circuit 108 is lower than that of the capacitor 106, the control circuit 116 controls the capacitor 106 and the power supply circuit 114 to be connected. When the output voltage of the rectifier circuit 108 is higher than that of the capacitor 106, the control circuit 116 operates so that the output of the rectifier circuit 108 is input to the power supply circuit 114. In other words, the control circuit 116 controls the direction of current in accordance with the voltage output from the rectifier circuit 108 and the voltage output from the capacitor 106.

Moreover, as shown in FIG. 8 of Embodiment 3, the power is intermittently supplied from the capacitor 106 to the load 118 through the power supply circuit 114, whereby the amount of power consumption can be reduced. Furthermore, a plurality of antennas may be provided as shown in Embodiment 4.

In the power storage device of this embodiment, power of an electromagnetic wave received at the antenna and power stored in the capacitor are compared by the control circuit depending on a reception state of an electromagnetic wave, whereby a path of power supplied to the load can be selected. Accordingly, the power stored in the capacitor can be efficiently utilized, and the power can be stably supplied to the load.

EMBODIMENT 6

This embodiment will describe a transistor that can be applied to the power supply control circuit 14 in Embodiments 1 to 5.

Figure 17:
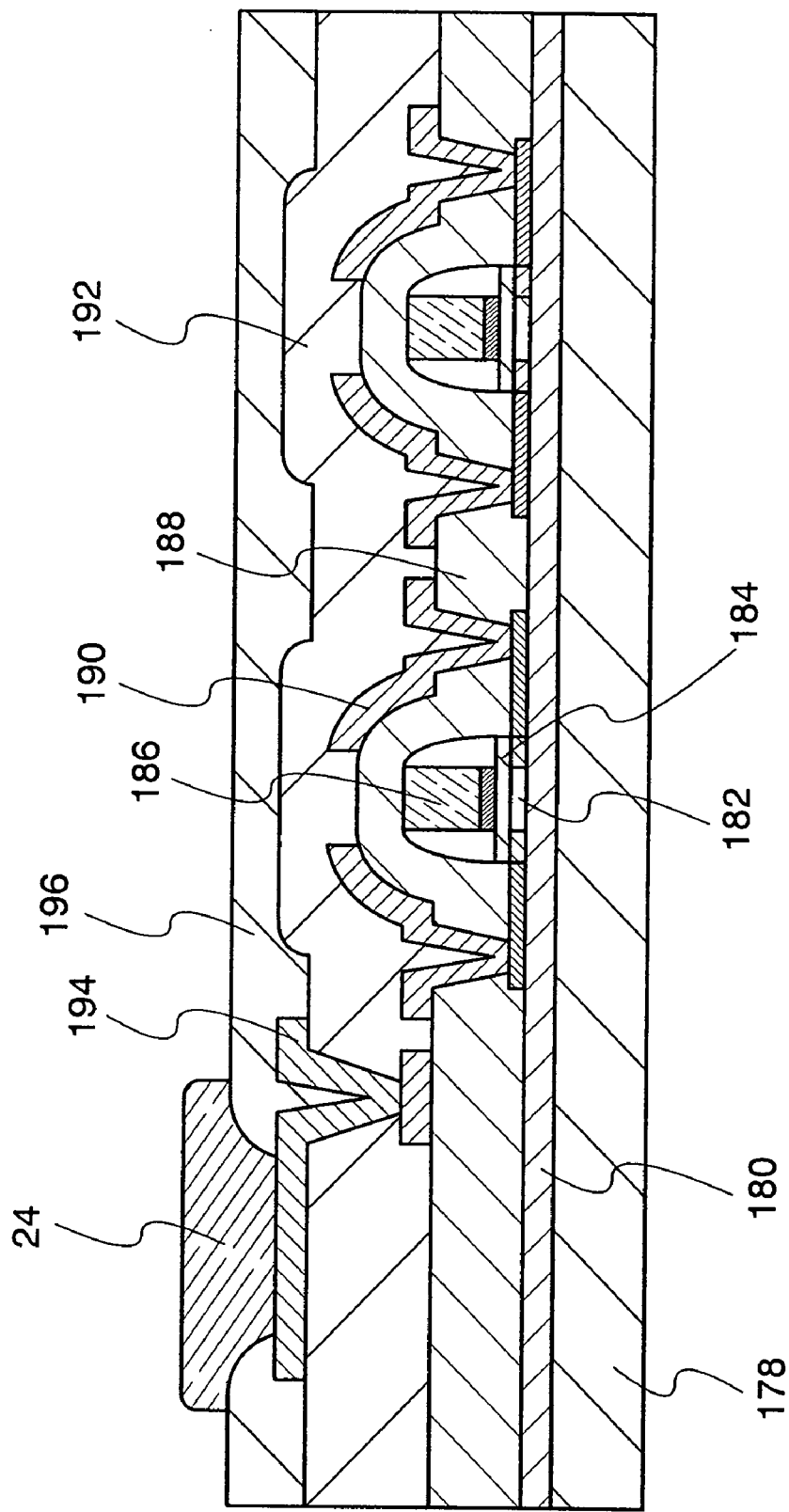
FIG. 17 is a cross-sectional view for explaining a structure of a thin film transistor used for forming a power supply control circuit.

FIG. 17 shows a thin film transistor formed over a substrate 178 having an insulating surface. A glass substrate such as aluminosilicate glass, a quartz substrate, or the like can be employed as the substrate. The thickness of the substrate 178 is 400 μm to 700 μm; however, the substrate may be polished to have a thin thickness of 5 μm to 100 μm. This is because the mechanical strength can be maintained by using the substrate with the second structural body as shown in Embodiments 1 to 3.

A first insulating layer 180 may be formed using silicon nitride or silicon oxide over the substrate 178. The first insulating layer 180 has an effect for stabilizing characteristics of the thin film transistor. A semiconductor layer 182 is preferably polycrystalline silicon. Alternatively, the semiconductor layer 182 may be a single crystalline silicon thin film, of which a crystal grain boundary does not affect drift of carriers in a channel formation region overlapping with a gate electrode 186.

As another structure, the substrate 178 may be formed using a silicon semiconductor, and the first insulating layer 180 may be formed using silicon oxide. In this case, the semiconductor layer 182 can be formed using single crystalline silicon. In other words, a SOI (Silicon on Insulator) substrate can be used.

The gate electrode 186 is formed over the semiconductor layer 182 with a gate insulating layer 184 interposed therebetween. Sidewalls may be formed on opposite sides of the gate electrode 186, and a lightly doped drain may be formed in the semiconductor layer 182 by the sidewalls. A second insulating layer 188 is formed using silicon oxide and silicon oxynitiride. The second insulating layer 188 is a so-called interlayer insulating layer, and a first wiring 190 is formed thereover. The first wiring 190 is connected to a source region and a drain region formed in the semiconductor layer 182.

A third insulating layer 192 is formed using silicon nitride, silicon oxynitiride, silicon oxide, or the like, and a second wiring 194 is formed. Although the first wiring 190 and the second wiring 194 are shown in FIG. 17, the number of wirings to be stacked may be selected as appropriate, depending on the circuit structures. As for a wiring structure, an embedded plug may be formed by selective growth of tungsten in a contact hole, or a copper wiring may be formed by a damascene process.

A connection electrode 24 is exposed on an outermost surface of the power supply control circuit 14. The other region than the connection electrode 24 is covered with a fourth insulating layer 196, for example, so as not to expose the second wiring 194. The fourth insulating layer 196 is preferably formed using silicon oxide that is formed by coating in order to planarize a surface thereof. The connection electrode 24 is formed by forming a bump of copper or gold by a printing method or a plating method so as to lower contact resistance thereof.

As described above, an integrated circuit includes a thin film transistor, whereby the power supply control circuit 14 that operates by receiving a communication signal in a microwave band (2.45 GHz) from an RF band (typically, 13.56 MHz) can be formed.

EMBODIMENT 7

Figure 18:
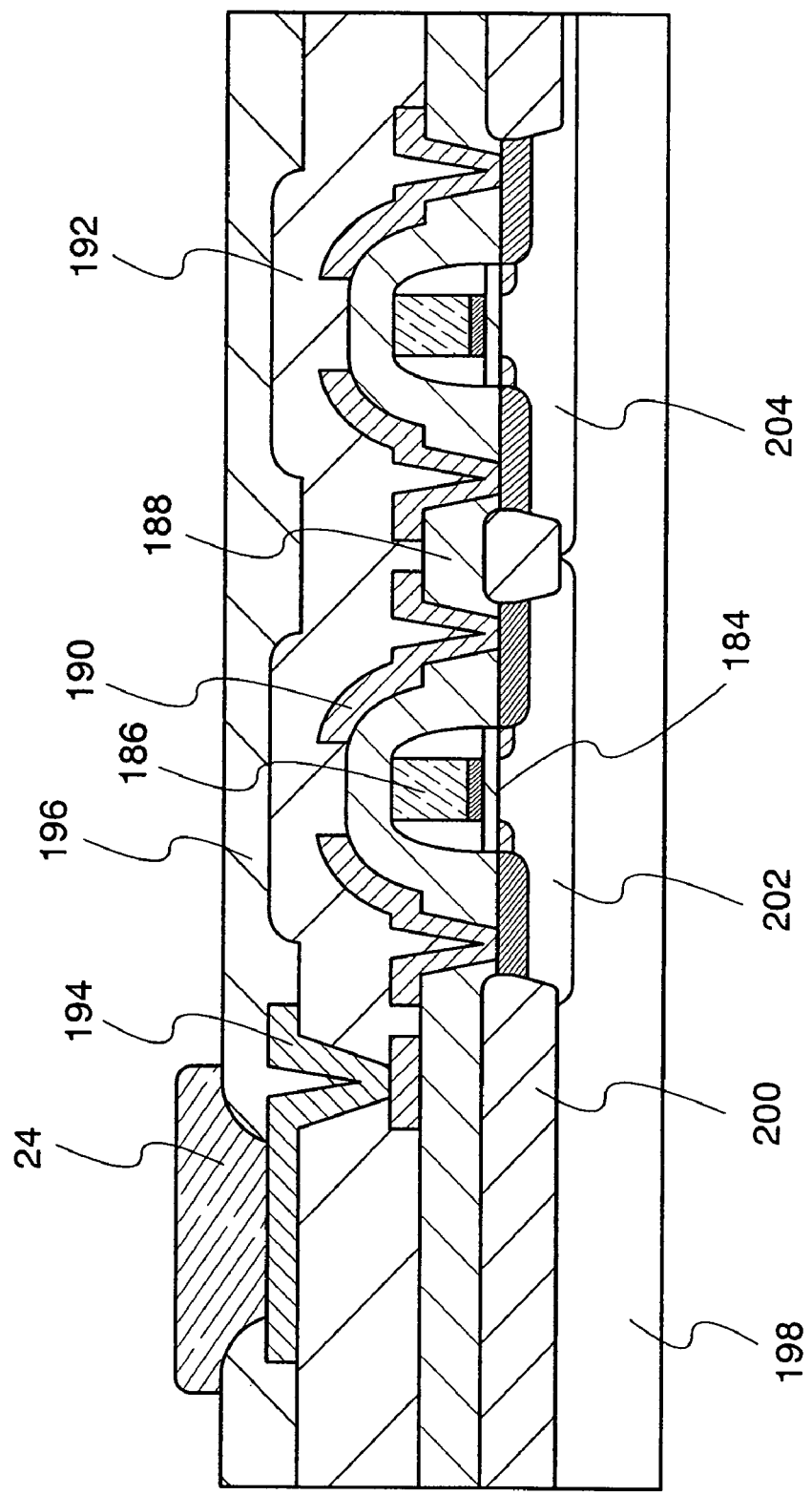
FIG. 18 is a cross-sectional view for explaining a structure of a MOS transistor used for forming a power supply control circuit.

This embodiment will describe another structure of the transistor that is applied to the power supply control circuit 14 in Embodiments 1 to 5 shown in FIG. 18. Note that a portion having the same function as that of Embodiment 6 is denoted by the same reference numeral.

FIG. 18 shows a MOS (Metal Oxide Semiconductor) transistor, which is formed utilizing a semiconductor substrate 198. A single crystalline silicon substrate is typically employed as the semiconductor substrate 198. The thickness of the substrate 198 is 100 μm to 300 μm; however, the substrate 198 may be polished to be as thin as 10 μm to 100 μm. This is because the mechanical strength can be maintained when the substrate is used with the second structural body 12 as shown in Embodiments 1 to 3.

An element isolation-insulating layer 200 is formed over the semiconductor substrate 198. The element isolation-insulating layer 200 can be formed using a LOCOS (Local Oxidation of Silicon) technique, in which a mask such as a nitride film is formed over the semiconductor substrate 198 and is thermally oxidized to be an oxide film for element isolation. Alternatively, the element isolation-insulating layer 200 may be formed by using a STI (Shallow Trench Isolation) technique in which a groove in the semiconductor substrate 198 is formed and an insulating film is embedded therein and is planarized. When the STI technique is used, the element isolation insulating layer 200 can have a steep side walls, and the distance for element isolation can be reduced.

An n-well 202 and a p-well 204 are formed in the semiconductor substrate 198, and accordingly, a so-called double well structure can be formed, in which an n-channel transistor and a p-channel transistor are included. Alternatively, a single-well structure may be used. A gate insulating layer 184, a gate electrode 186, a second insulating layer 188, a first wiring 190, a third insulating layer 192, a second wiring 194, a connection electrode 24, and a fourth insulating layer 196 are similar to those of Embodiment 6.

As described above, an integrated circuit includes a MOS transistor, whereby the power supply control circuit 14 can be formed, which operates by receiving a communication signal in a microwave (2.45 GHz) band from an RF band (typically, 13.56 MHz).

EMBODIMENT 8

Figure 19:
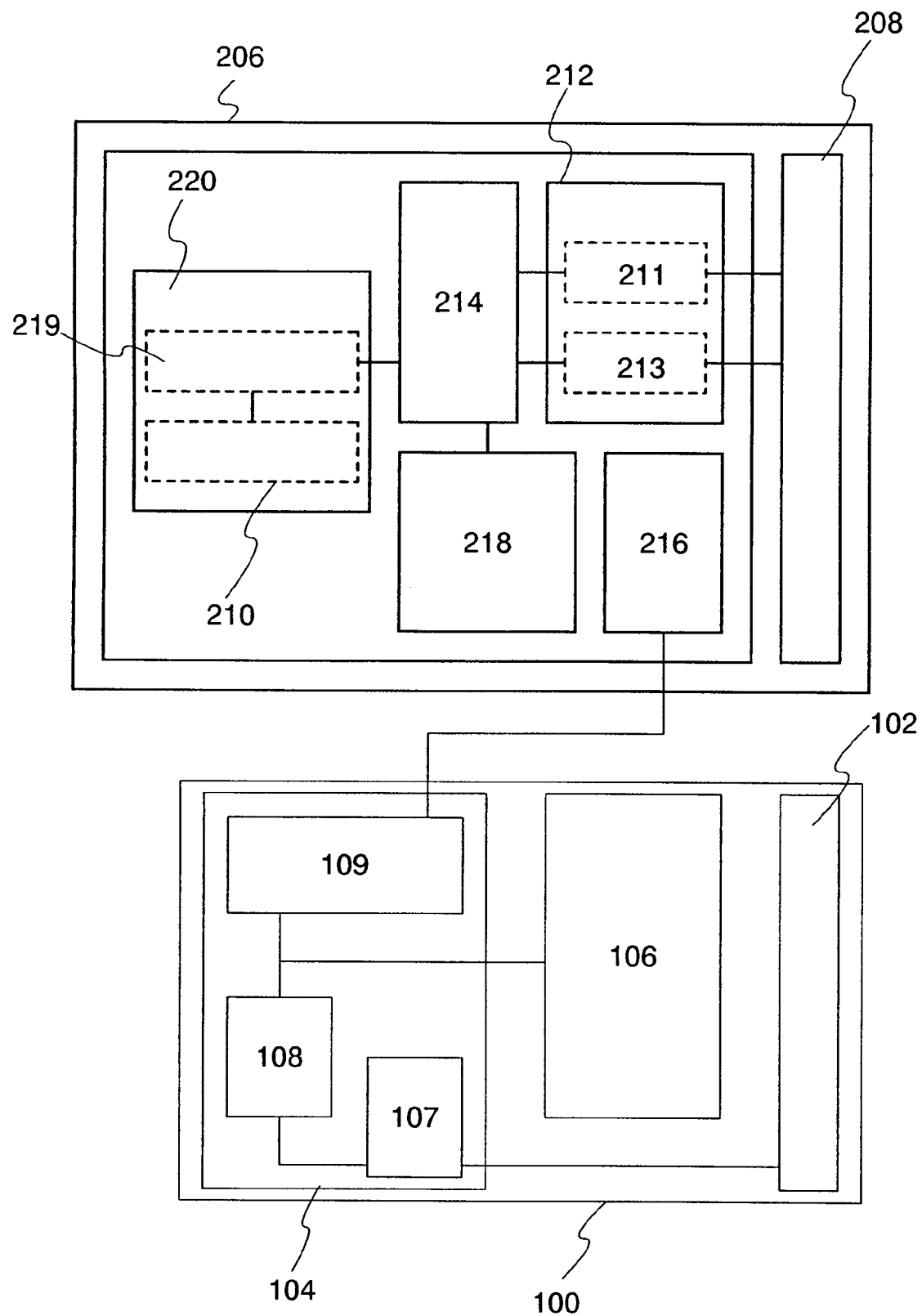
FIG. 19 is a block diagram showing a structure of an active wireless tag.

This embodiment describes an example of a so-called active wireless tag in which an IC (integrated circuit) with a sensor and a power storage device that supplies driving power to the IC with a sensor are provided which is shown in FIG. 19.

This active wireless tag is provided with an IC 206 with a sensor and a power storage device 100. The power storage device 100 includes an antenna 102, a power supply control circuit 104, and a capacitor 106.

In the power storage device 100, an electromagnetic wave received at the antenna 102 generates induced electromotive force at a resonance circuit 107. The induced electromotive force is stored in the capacitor 106 through a rectifier circuit 108. When power is supplied to the IC 206 with a sensor, the power is output after an output voltage is stabilized by a constant voltage circuit 109.

In the IC 206 with a sensor, a sensor portion 220 has a function for detecting temperature, humidity, illuminance, and other characteristics by a physical or chemical means. The sensor portion 220 includes a sensor 210 and a sensor driving circuit 219 for controlling the sensor 210. The sensor 210 is formed using a semiconductor element such as a resistor element, a capacitive coupling element, an inductive coupling element, a photovoltaic element, a photoelectric conversion element, a thermoelectric element, a transistor, a thermistor, a diode, or the like. The sensor driving circuit 219 detects changes in impedance, reactance, inductance, a voltage or current; converts signals from analog to digital (A/D conversion); and outputs the signals to a control circuit 214.

A memory portion 218 is provided with a read-only memory and a rewritable memory. The memory portion 218 is formed of a static RAM, an EEPROM (Electrically Erasable Programmable Read-Only Memory), a flash memory, or the like, whereby information received through the sensor portion 220 and an antenna 208 can be recorded as needed. In order to memorize the obtained data in the sensor portion 220, the memory portion 218 preferably includes a nonvolatile memory that is capable of sequentially writing and holding the memorized data. Further, a program for making the sensor portion 220 operate may be memorized in the memory portion 218. While the program is practiced, the sensor portion 220 can operate at the timing that is set in advance to obtain data without sending a control signal from outside.

A communication circuit 212 includes a demodulation circuit 211 and a modulation circuit 213. The demodulation circuit 211 demodulates a signal that is input via the antenna 208 and outputs the signal to the control circuit 214. The signal includes a signal for controlling the sensor portion 220 and/or information to be memorized in the memory portion 218. A signal output from the sensor driving circuit 219 and information that is read from the memory portion 218 are output to the modulation circuit 213 via the control circuit 214. The modulation circuit 213 modulates the signal into a signal capable of wireless communication and outputs the signal to the external device via the antenna 208.

Power necessary for operation of the control circuit 214, the sensor portion 220, the memory portion 218, and the communication circuit 212 is supplied from the power storage device 100. A power supply circuit 216 transforms the power supplied from the power storage device 100 into a predetermined voltage and supplies the voltage to each circuit. For example, in a case where data is written in the above nonvolatile memory, a voltage is temporary boosted to 10V to 20V. Further, a clock signal is generated for making the control circuit operate.

As described above, by using the power storage device 100 with the IC 206 with a sensor, the sensor portion is effectively utilized, and information can be obtained wirelessly to be memorized.

Figure 20:
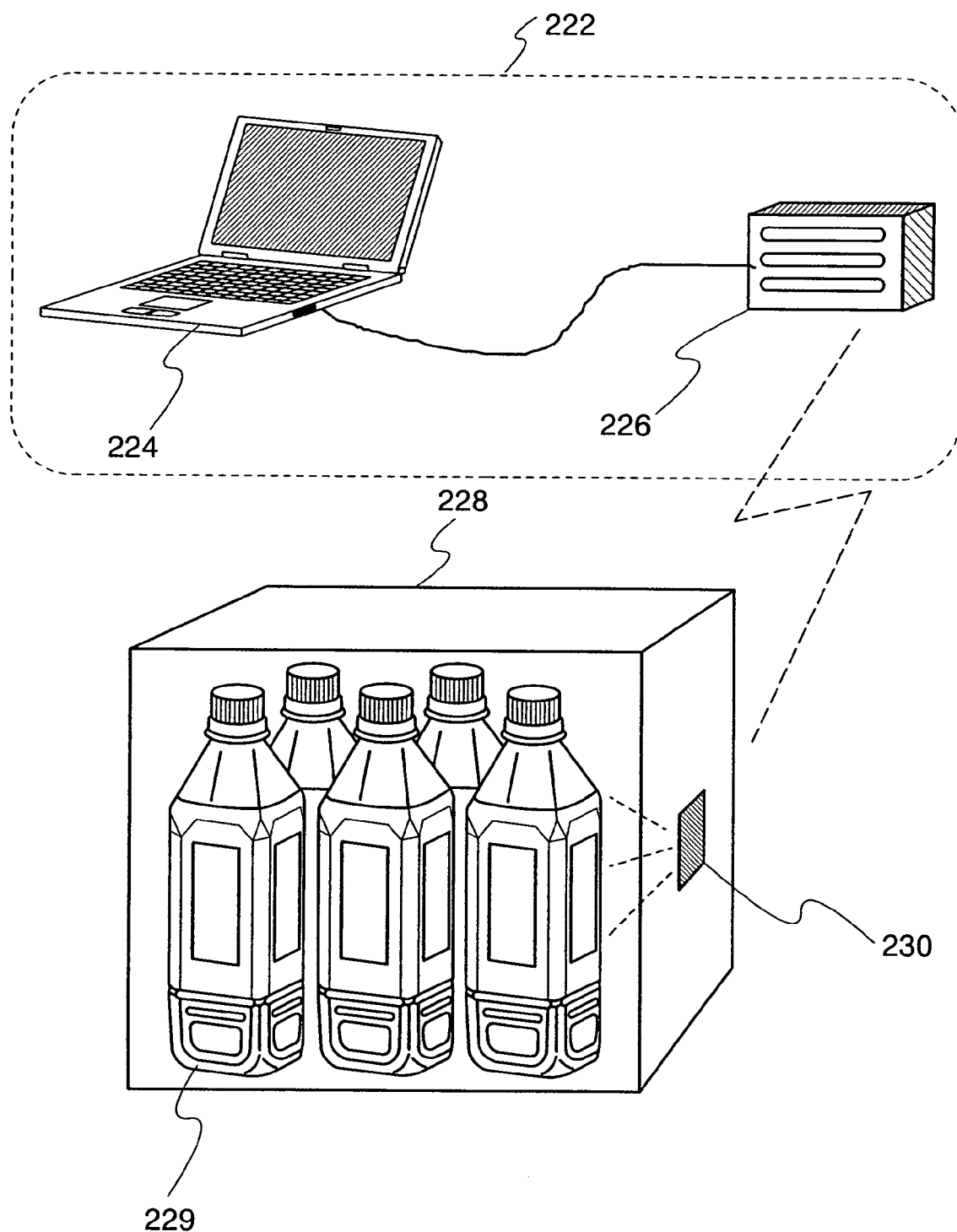
FIG. 20 is a view showing an example of distribution management using an active wireless tag.

FIG. 20 shows an example of distribution management using an active wireless tag 230. The active wireless tag 230 includes the IC with a sensor and the power storage device shown in FIG. 19. This active wireless tag 230 is attached to a packing box 228 containing products 229. A product management system 222 comprises a computer 224 and a communication device 226 connected to the computer 224, and the system 222 is used for management of the active wireless tag 230. The communication devices 226 can be located in each portion where the products are distributed, by using the communication network.

The distribution management can employ various modes. For example, when a temperature sensor, a humidity sensor, a light sensor, or the like is used as a sensor of the active wireless tag 230, the environments where the packing box 228 is kept during the distribution process can be managed. In this case, the power storage device is provided for the active wireless tag 230; therefore, the sensor can operate at a given timing independently from a control signal from the communication device 226, and the environment data can be obtained. Furthermore, even when the distance between the communication device 226 and the active wireless tag 230 is large, the communication distance can be increased with the use of power of the power storage device.

As described, the active wireless tag provided with the IC with a sensor and the power storage device is used, whereby a variety of information is obtained wirelessly with sensors, and the information can be managed by the computer.

(Additional Note)

As described above, the present invention includes at least the following structure.

An aspect of the present invention is a power storage device including a first structural body provided with an antenna, a power supply control circuit formed using a semiconductor layer interposed between insulating layers that are provided over and below the semiconductor layer, and a second structural body provided with a capacitor and having higher rigidity than the first structural body, where the antenna and the power supply control circuit are connected with a through electrode formed in the second structural body, the power supply control circuit includes a rectifier circuit, a switching circuit, a low-frequency signal generation circuit, and a power supply circuit, and the switching circuit controls power that is supplied from the capacitor or the antenna to the power supply circuit in accordance with a signal from the low-frequency signal generation circuit.

Another aspect of the present invention is a power storage device including a first structural body provided with an antenna, a power supply control circuit formed using a semiconductor layer interposed between insulating layers that are provided over and below the semiconductor layer, and a second structural body provided with a capacitor and having higher rigidity than the first structural body, where the antenna and the power supply control circuit are connected with a through electrode formed in the second structural body, the power supply control circuit includes a rectifier circuit, a control circuit, a switching circuit, a low-frequency signal generation circuit, and a power supply circuit, the control circuit selects power that is output to the switching circuit by comparing power supplied from the antenna with power supplied from the capacitor, and the switching circuit outputs the power selected by the control circuit to the power supply circuit in accordance with a signal from the low-frequency signal generation circuit.

Another aspect of the present invention is a power storage device including a first structural body provided with an antenna, a power supply control circuit formed using a semiconductor layer interposed between insulating layers that are provided over and below the semiconductor layer, and a second structural body provided with a capacitor and having higher rigidity than the first structural body, where the power supply control circuit has a connection portion of the antenna and the capacitor, which is interposed between the first structural body and the second structural body, the power supply control circuit includes a rectifier circuit, a switching circuit, a low-frequency signal generation circuit, and a power supply circuit, and the switching circuit controls power that is supplied from the capacitor or the antenna to the power supply circuit in accordance with a signal from the low-frequency signal generation circuit.

Another aspect of the present invention is a power storage device including a first structural body provided with an antenna, a power supply control circuit formed using a semiconductor layer interposed between insulating layers that are provided over and below the semiconductor layer, and a second structural body provided with a capacitor and has higher rigidity than the first structural body, where the power supply control circuit having a connection portion of the antenna and the capacitor, which is interposed between the first structural body and the second structural body, the power supply control circuit includes a rectifier circuit, a control circuit, a switching circuit, a low-frequency signal generation circuit, and a power supply circuit, the control circuit selects power that is output to the switching circuit by comparing power supplied from the antenna with power supplied from the capacitor, and the switching circuit controls an output of power to the power supply circuit, which is selected by the control circuit in accordance with a signal from the low-frequency signal generation circuit.

This application is based on Japanese Patent Application serial no. 2006-206939 filed in Japan Patent Office on Jul. 28, 2006, the entire contents of which are hereby incorporated by reference.

What is claimed is:

1. A power storage device comprising:
   a first structural body having an antenna;
   a power supply control circuit having a semiconductor layer interposed between an insulating layer over the semiconductor layer and an insulating layer below the semiconductor layer; and
   a second structural body having a capacitor and a through electrode, the through electrode formed through the second structural body,
   wherein the antenna and the power supply control circuit are connected with the through electrode, and
   wherein the second structural body has higher rigidity than the first structural body.

2. A power storage device comprising:
   a first structural body having an antenna;
   a power supply control circuit having a semiconductor layer interposed between an insulating layer over the semiconductor layer and an insulating layer below the semiconductor layer, the power supply control circuit comprising a rectifier circuit, a switching circuit, a low-frequency signal generation circuit, and a power supply circuit; and
   a second structural body having a capacitor and a through electrode, the through electrode formed through the second structural body,
   wherein the antenna and the power supply control circuit are connected with the through electrode,
   wherein the switching circuit controls power that is supplied from the capacitor or the antenna to the power supply circuit in accordance with a signal from the low-frequency signal generation circuit, and
   wherein the second structural body has higher rigidity than the first structural body.

3. A power storage device comprising:
   a first structural body having an antenna;
   a second structural body having a capacitor and higher rigidity than the first structural body; and
   a power supply control circuit having a first connection electrode for connecting with the antenna and a second connection electrode for connecting with the capacitor, the power supply control circuit interposed between the first structural body and the second structural body, wherein the power supply control circuit comprises a rectifier circuit, a switching circuit, a low-frequency signal generation circuit, and a power supply circuit, and wherein the switching circuit controls power that is supplied from the capacitor or the antenna to the power supply circuit in accordance with a signal from the low-frequency signal generation circuit.

4. A power storage device according to claim 2, further comprising:

a control circuit in the power supply control circuit, wherein the control circuit selects a signal from the capacitor when power supplied form the rectifier circuit is smaller than power supplied from the capacitor and the control circuit selects a signal from the rectifier circuit when the power supplied from the rectifier circuit is larger than the power supplied from the capacitor.

5. A power storage device according to claim 3, further comprising:

a control circuit in the power supply control circuit, wherein the control circuit selects a signal from the capacitor when power supplied form the rectifier circuit is smaller than power supplied from the capacitor and the control circuit selects a signal from the rectifier circuit when the power supplied from the rectifier circuit is larger than the power supplied from the capacitor.

6. A power storage device according to claim 1, wherein the capacitor has a structure in which a dielectric layer and a capacitor electrode are alternately stacked.

7. A power storage device according to claim 2, wherein the capacitor has a structure in which a dielectric layer and a capacitor electrode are alternately stacked.

8. A power storage device according to claim 3, wherein the capacitor has a structure in which a dielectric layer and a capacitor electrode are alternately stacked.

9. A power storage device according to claim 1, wherein the first structural body comprises a plastic sheet, a plastic film, a glass epoxy resin, a glass plate, paper, or a nonwoven fabric.

10. A power storage device according to claim 2, wherein the first structural body comprises a plastic sheet, a plastic film, a glass epoxy resin, a glass plate, paper, or a nonwoven fabric.

11. A power storage device according to claim 3, wherein the first structural body comprises a plastic sheet, a plastic film, a glass epoxy resin, a glass plate, paper, or a nonwoven fabric.

12. A power storage device according to claim 1, wherein the second structural body comprises a ceramic material.

13. A power storage device according to claim 2, wherein the second structural body comprises a ceramic material.

14. A power storage device according to claim 3, wherein the second structural body comprises a ceramic material.

15. A power storage device according to claim 1, wherein the power supply control circuit comprises a plurality of transistors.

16. A power storage device according to claim 2, wherein the power supply control circuit comprises a plurality of transistors.

17. A power storage device according to claim 3, wherein the power supply control circuit comprises a plurality of transistors.

* * * * *